US012690478B2

(12) United States Patent
Kang

(10) Patent No.: US 12,690,478 B2
(45) Date of Patent: Jul. 21, 2026

(54) SEMICONDUCTOR PACKAGE HAVING SEMICONDUCTOR CHIP ON WIRING LAYERS AND METHOD OF FABRICATING THE SAME

(71) Applicant: SAMSUNG ELECTRONICS CO., LTD., Suwon-si (KR)

(72) Inventor: Myungsam Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 530 days.

(21) Appl. No.: 18/096,132

(22) Filed: Jan. 12, 2023

(65) Prior Publication Data

US 2023/0411275 A1 Dec. 21, 2023

(30) Foreign Application Priority Data

Jun. 15, 2022 (KR) ........................ 10-2022-0072856

(51) Int. Cl.
*H10W 70/69* (2026.01)
*H10W 70/05* (2026.01)
*H10W 74/10* (2026.01)
*H10W 90/00* (2026.01)
*H10W 74/00* (2026.01)

(52) U.S. Cl.
CPC ......... *H10W 70/69* (2026.01); *H10W 70/095* (2026.01); *H10W 74/117* (2026.01); *H10W 90/701* (2026.01); *H05K 2203/1316* (2013.01); *H10W 74/00* (2026.01); *H10W 90/724* (2026.01)

(58) Field of Classification Search
CPC ............. H01L 23/49894; H01L 21/486; H01L 23/3128; H01L 23/49816; H01L 24/16; H10W 70/69; H10W 90/701; H10W 70/095; H10W 74/117
See application file for complete search history.

(56) References Cited

U.S. PATENT DOCUMENTS

| | | | |
|---|---|---|---|
| 7,034,401 | B2 | 4/2006 | Savastiouk et al. |
| 7,919,849 | B2 | 4/2011 | Kodama et al. |
| 8,555,494 | B2 | 10/2013 | Jomaa |
| 8,859,912 | B2 | 10/2014 | Tseng et al. |

(Continued)

FOREIGN PATENT DOCUMENTS

| | | |
|---|---|---|
| JP | 5942823 B2 | 6/2016 |
| KR | 20130057803 A | 6/2013 |

(Continued)

*Primary Examiner* — Michael Jung
(74) *Attorney, Agent, or Firm* — Muir Patent Law, PLLC

(57) ABSTRACT

A semiconductor package includes stacked wiring layers, a lower substrate pad on a bottom surface of a lowermost wiring layer, a protection layer covering the lower substrate pad on the bottom surface of the lowermost wiring layer, a dielectric layer on a top surface of an uppermost wiring layer, an upper substrate pad on the dielectric layer, a semiconductor chip on the upper substrate pad, and a molding layer covering the semiconductor chip on the uppermost wiring layer. Each of the wiring layers includes a dielectric pattern and a wiring pattern therein. The protection layer has openings that expose the lower substrate pad. A thickness of the dielectric layer is less than that of the dielectric pattern in the wiring layers. A thickness of the upper substrate pad is less than that of the wiring pattern in the wiring layers.

20 Claims, 16 Drawing Sheets

(56)     References Cited

U.S. PATENT DOCUMENTS

| | | | |
|---|---|---|---|
| 9,257,386 | B2 | 2/2016 | Arisaka et al. |
| 2007/0096292 | A1 | 5/2007 | Machida |
| 2021/0193555 | A1* | 6/2021 | Lee .................. H01L 23/49822 |
| 2021/0398890 | A1* | 12/2021 | Kim .................. H01L 23/49822 |
| 2022/0053639 | A1 | 2/2022 | Fang et al. |
| 2022/0102256 | A1* | 3/2022 | Kwon ..................... H01L 24/05 |
| 2023/0073823 | A1* | 3/2023 | Kim ........................ H01L 24/14 |
| 2023/0307404 | A1* | 9/2023 | Kuo ........................ H01L 24/14 |

FOREIGN PATENT DOCUMENTS

| | | | |
|---|---|---|---|
| KR | 20180049336 | A | 5/2018 |
| KR | 20210157781 | A | 12/2021 |
| KR | 20220067630 | A | 5/2022 |

* cited by examiner

SEMICONDUCTOR PACKAGE HAVING SEMICONDUCTOR CHIP ON WIRING LAYERS AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0072856, filed on Jun. 15, 2022, in the Korean Intellectual Property Office, the disclosure of which is hereby incorporated by reference in its entirety.

BACKGROUND

1. Field

Embodiments relate to a semiconductor package and a method of fabricating the same, and more particularly, to a semiconductor package including a wiring structure and a method of fabricating the same.

2. Description of the Related Art

Semiconductor chips are gradually becoming compact with the continuous development of semiconductor technology. Further, various functions are integrated into a single semiconductor chip. Therefore, semiconductor chips require a great number of input/output pads on a small area.

A semiconductor package is provided to implement an integrated circuit chip to qualify for use in electronic products. A semiconductor package is typically configured such that a semiconductor chip is mounted on a printed circuit board and bonding wires or bumps are used to electrically connect the semiconductor chip to the printed circuit board. Various studies are conducted to improve structural stability and electrical properties without pattern abnormality.

SUMMARY

According to some embodiments, a semiconductor package may include: wiring layers that are sequentially stacked; a lower substrate pad on a bottom surface of a lowermost wiring layer of the wiring layers; a protection layer on the bottom surface of the lowermost wiring layer, the protection layer covering the lower substrate pad; a dielectric layer on a top surface of an uppermost wiring layer of the wiring layers; an upper substrate pad on the dielectric layer; a semiconductor chip mounted on the upper substrate pad; and a molding layer on the uppermost wiring layer, the molding layer covering the semiconductor chip. Each of the wiring layers may include: a dielectric pattern; and a wiring pattern in the dielectric pattern. The protection layer may have openings that expose the lower substrate pad. A thickness of the dielectric layer may be less than a thickness of the dielectric pattern in the wiring layers. A thickness of the upper substrate pad may be less than a thickness of the wiring pattern in the wiring layers.

According to some embodiments, a semiconductor package may include: a wiring substrate; a semiconductor chip on the wiring substrate; and a molding layer on the wiring substrate, the molding layer covering the semiconductor chip. The wiring substrate may include: dielectric patterns that are stacked on one another; wiring patterns in the dielectric patterns; a dielectric layer that covers a top surface of an uppermost dielectric pattern of the dielectric patterns;

upper substrate pads on the dielectric layer; lower substrate pads on a bottom surface of a lowermost dielectric pattern of the dielectric patterns; and a protection layer on the bottom surface of the lowermost dielectric pattern, the protection layer covering the lower substrate pads. The protection layer may have openings that expose the lower substrate pads. A thickness of the dielectric layer may be less than a thickness of the dielectric patterns. The thickness of the dielectric layer may be in a range of about 1 μm to about 4 μm.

According to some embodiments, a method of fabricating a semiconductor package may include: sequentially stacking a first metal thin layer, a second metal thin layer, and a dielectric thin layer on a carrier substrate; patterning the dielectric thin layer to form openings that expose the second metal thin layer; forming a first metal layer on the dielectric thin layer, and then patterning the first metal layer to form a first wiring pattern; forming on the dielectric thin layer a wiring dielectric layer that covers the first wiring pattern, and then patterning the wiring dielectric layer to form a first dielectric pattern; forming a second metal layer on the first dielectric pattern, and then patterning the second metal layer to form first substrate pads; forming a protection layer on the first dielectric pattern, and then patterning the protection layer to expose the first substrate pads; removing the carrier substrate and the first metal thin layer; and patterning the second metal thin layer to form second substrate pads. A thickness of the second metal thin layer may be less than a thickness of the first metal layer. The thickness of the second metal layer may be in a range of about 1 μm to about 5 μm. A thickness of the dielectric thin layer may be less than a thickness of the wiring dielectric layer. The thickness of the dielectric thin layer may be in a range of about 1 μm to about 4 μm.

BRIEF DESCRIPTION OF THE DRAWINGS

Features will become apparent to those of skill in the art by describing in detail exemplary embodiments with reference to the attached drawings in which:

FIG. 1 illustrates a cross-sectional view showing a wiring substrate according to some embodiments.

FIG. 4 illustrates a cross-sectional view showing a wiring substrate according to some embodiments.

FIGS. 7 to 9 illustrate cross-sectional views showing a semiconductor package according to some embodiments.

FIGS. 10 to 23 illustrate cross-sectional views showing stages in a method of fabricating a wiring substrate according to some embodiments.

DETAILED DESCRIPTION

Figure 1:
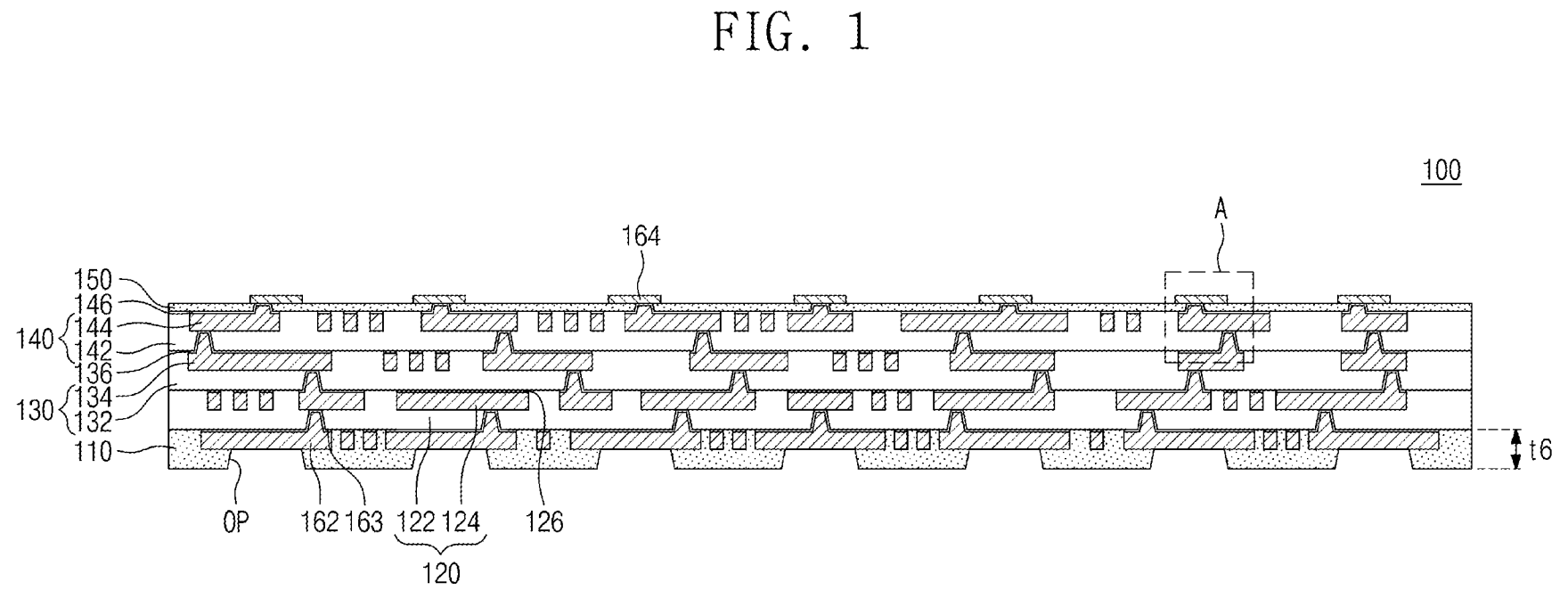
Figure 2:
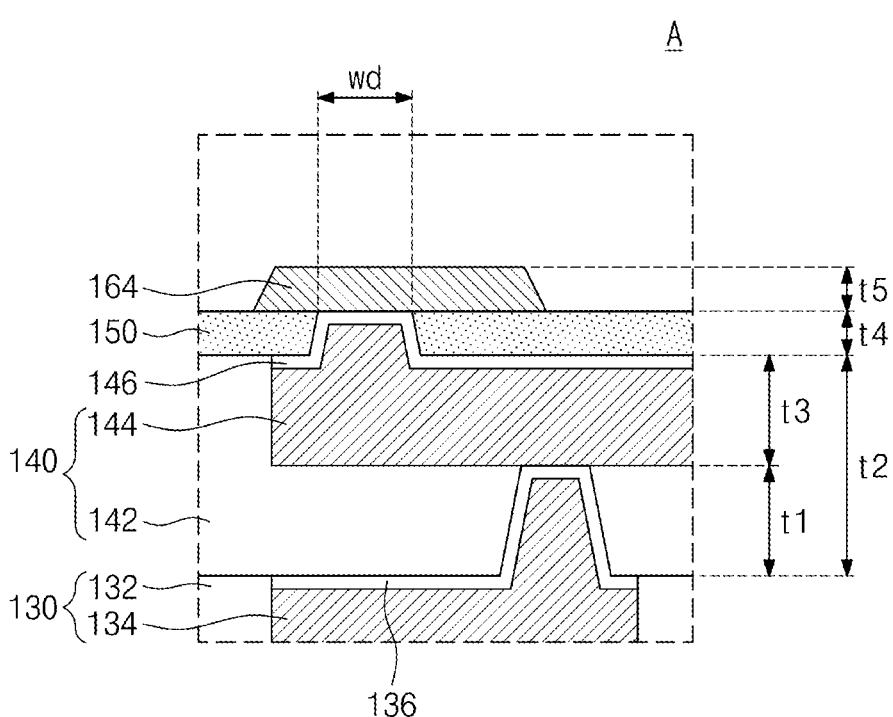
FIGS. 2 and 3 illustrate enlarged views showing section A of FIG. 1.
Figure 3:
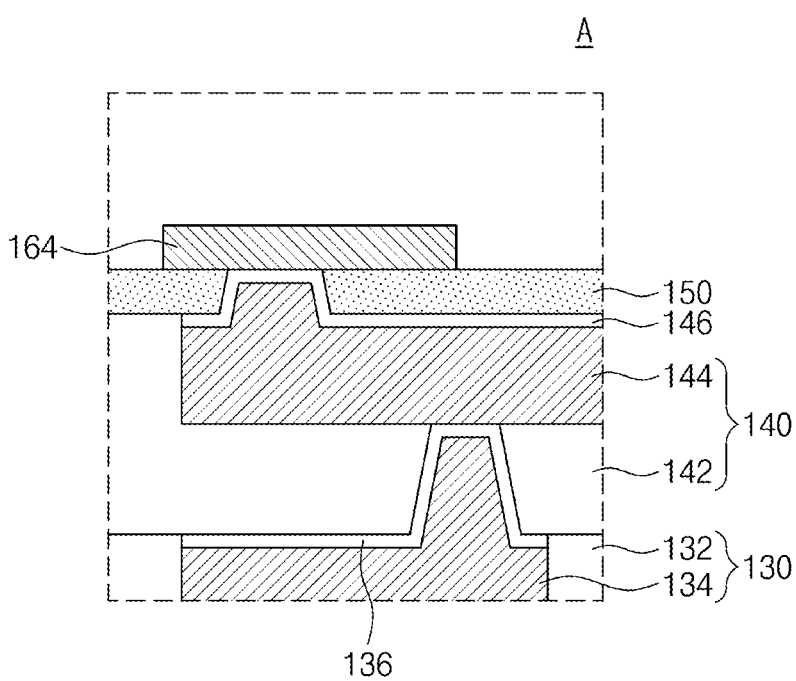

FIG. 1 illustrates a cross-sectional view showing a wiring substrate according to some embodiments. FIGS. 2 and 3 illustrate enlarged views of section A of FIG. 1.

Referring to FIGS. 1 to 3, a wiring substrate 100 may be provided. The wiring substrate 100 may have a protection layer 110, at least two substrate wiring layers, and a dielectric layer 150. In this description, the term "substrate wiring layer" indicates a wiring layer that is formed by patterning each of one dielectric material layer and one conductive material layer. For example, conductive patterns in one substrate wiring layer may be horizontally extending lines that do not vertically overlap each other. In this description, the "horizontal" direction refers to a direction parallel to the top surface of the wiring substrate 100, and the "vertical" direction refers to a direction along a normal direction to the top surface of the wiring substrate 100.

For example, the at least two substrate wiring layers may include a first substrate wiring layer 120, a second substrate wiring layer 130, and a third substrate wiring layer 140 that are sequentially stacked. The first through third substrate wiring layers 120, 130, and 140 may correspondingly include dielectric patterns 122, 132, and 142, and may also correspondingly include wiring patterns 124, 134, and 144 in the dielectric patterns 122, 132, and 142. One of the wiring patterns 124, 134, and 144 of the substrate wiring layers 120, 130, and 140 may be electrically connected to a different one of the wiring patterns 124, 134, and 144 in an adjacent one of the other ones of the substrate wiring layers 120, 130, and 140.

The first substrate wiring layer 120 may be provided. The first substrate wiring layer 120 may include a first dielectric pattern 122 and a first wiring pattern 124. The first wiring pattern 124 may be provided in the first dielectric pattern 122.

The first dielectric pattern 122 may have a thickness ranging from about 10 μm to about 40 μm, e.g., in the vertical direction. For example, the first dielectric pattern 122 may include an inorganic dielectric layer, e.g., a silicon oxide (SiO) layer and/or a silicon nitride (SiN) layer. In another example, the first dielectric pattern 122 may include a polymeric material, e.g., a dielectric polymer and/or a photo-imageable dielectric (PID). For example, the photo-imageable dielectric may include at least one of photosensitive polyimide, polybenzoxazole (PBO), phenolic polymers, and benzocyclobutene polymers.

The first wiring pattern 124 may have a damascene structure. For example, the first wiring pattern 124 may have a head portion and a tail portion that are connected into a single unitary body. The head portion may be a wiring or pad portion that horizontally extends in a line in the wiring substrate 100. The tail portion may be a via portion that vertically connects to a line, e.g., to the head portion, in the wiring substrate 100 with a certain component. The first wiring pattern 124 may have a cross section shaped like an inverse T. The head portion of the first wiring pattern 124 may be buried in an upper portion of the first dielectric pattern 122, and the head portion of the first wiring pattern 124 may have a top surface that is exposed on a top surface of the first dielectric pattern 122. The tail portion of the first wiring pattern 124 may extend from the top surface of the head portion of the first wiring pattern 124, and may penetrate the second dielectric pattern 132 of the second substrate wiring layer 130 positioned on the first wiring pattern 124 to come into connection with the head portion of the second wiring pattern 134 of the second substrate wiring layer 130. The first wiring pattern 124 may have a thickness ranging from about 5 μm to about 20 e.g., in the vertical direction.

In this description, the thickness of the first wiring pattern 124 indicates only a thickness of the head portion of the first wiring pattern 124 in the vertical direction, and a thickness of the tail portion of the first wiring pattern 124 will be described separately. A value ranging from about 5 μm to about 30 μm may be given to an interval between the head portion of the first wiring pattern 124 and the head portion of the second wiring pattern 134, or to a thickness of the tail portion of the first wiring pattern 124. The first wiring pattern 124 may include a conductive material, e.g., copper (Cu).

A first seed/barrier layer 126 may be interposed between the first wiring pattern 124 and the second dielectric pattern 132. The first seed/barrier layer 126 may conformally cover lateral and top surfaces of the first wiring pattern 124. A value ranging from about 50 angstroms to about 1,000 angstroms may be given to a gap between the first wiring pattern 124 and the second dielectric pattern 132 (i.e., to a thickness of the first seed/barrier layer 126). When the first seed/barrier layer 126 is used as a seed layer, the first seed/barrier layer 126 may include a metal, e.g., gold (Au). When the first seed/barrier layer 126 is used a barrier layer, the first seed/barrier layer 126 may include a metal, e.g., titanium (Ti) and/or tantalum (Ta), or a metal nitride, e.g., titanium nitride (TiN) and/or tantalum nitride (TaN).

The second substrate wiring layer 130 may have a configuration similar to that of the first substrate wiring layer 120. The second substrate wiring layer 130 may be disposed on the first substrate wiring layer 120. The second substrate wiring layer 130 may include the second dielectric pattern 132 and the second wiring pattern 134.

The second dielectric pattern 132 may cover the first substrate wiring layer 120. The second dielectric pattern 132 may have a thickness ranging from about 10 μm to about 40 For example, the second dielectric pattern 132 may include an inorganic dielectric layer, e.g., a silicon oxide (SiO) layer and/or a silicon nitride (SiN) layer. In another example, the second dielectric pattern 132 may include a polymeric material, e.g., a dielectric polymer and/or a photo-imageable dielectric (PID). For example, the photo-imageable dielectric may include at least one of photosensitive polyimide, polybenzoxazole (PBO), phenolic polymers, and benzocyclobutene polymers.

The second wiring pattern 134 may be provided in the second dielectric pattern 132. The second wiring pattern 134 may have a damascene structure. For example, the second wiring pattern 134 may have a head portion and a tail portion that are connected into a single unitary body. The second wiring pattern 134 may have a cross section shaped like an inverse T. The head portion of the second wiring pattern 134 may be buried in an upper portion of the second dielectric pattern 132, and the head portion of the second wiring pattern 134 may have a top surface that is exposed on a top surface of the second dielectric pattern 132. The tail portion of the second wiring pattern 134 may extend from the top surface of the head portion of the second wiring pattern 134, and may penetrate the third dielectric pattern 142 of the third substrate wiring layer 140 positioned on the second wiring pattern 134 to come into connection with the head portion of the third wiring pattern 144 of the third substrate wiring layer 140. The second wiring pattern 134 may have a thickness ranging from about 5 μm to about 20 μm. A value ranging from about 5 μm to about 30 μm may be given to an interval between the head portion of the second wiring pattern 134 and the head portion of the third wiring pattern 144 (i.e., a thickness t1 of the tail portion of the second wiring pattern 134). The second wiring pattern 134 may include a conductive material, e.g., copper (Cu).

A second seed/barrier layer 136 may be interposed between the second wiring pattern 134 and the third dielectric pattern 142. The second seed/barrier layer 136 may conformally cover lateral and top surfaces of the second wiring pattern 134. The second seed/barrier layer 136 may include a metal, e.g., gold (Au), titanium (Ti), and/or tantalum (Ta), or a metal nitride, e.g., titanium nitride (TiN) and/or tantalum nitride (TaN).

The third substrate wiring layer 140 may have a configuration similar to that of the first substrate wiring layer 120 and that of the second substrate wiring layer 130. The third substrate wiring layer 140 may be disposed on the second substrate wiring layer 130. The third substrate wiring layer 140 may include the third dielectric pattern 142 and the third wiring pattern 144.

The third dielectric pattern 142 may cover the second substrate wiring layer 130. The third dielectric pattern 142 may have a thickness t2 ranging from about 10 μm to about 40 μm. For example, the third dielectric pattern 142 may include an inorganic dielectric layer, e.g., a silicon oxide (SiO) layer and/or a silicon nitride (SiN) layer. In another example, the third dielectric pattern 142 may include a polymeric material, e.g., a dielectric polymer and/or a photo-imageable dielectric (PID). For example, the photo-imageable dielectric may include at least one of photosensitive polyimide, polybenzoxazole (PBO), phenolic polymers, and benzocyclobutene polymers.

The third wiring pattern 144 may be provided in the third dielectric pattern 142. The third wiring pattern 144 may have a damascene structure. For example, the third wiring pattern 144 may have a head portion and a tail portion that are connected into a single unitary body. The third wiring pattern 144 may have a cross section shaped like an inverse T. The head portion of the third wiring pattern 144 may be buried in an upper portion of the third dielectric pattern 142, and the head portion of the third wiring pattern 144 may have a top surface that is exposed on a top surface of the third dielectric pattern 142. The tail portion of the third wiring pattern 144 may extend from the top surface of the head portion of the third wiring pattern 144, and may penetrate the dielectric layer 150 disposed on the third wiring pattern 144 to come into connection with upper substrate pads 164 which will be discussed below. The third wiring pattern 144 may have a width t3 ranging from about 5 μm to about 20 μm. The third wiring pattern 144 may include a conductive material, e.g., copper (Cu).

A third seed/barrier layer 146 may be interposed between the third wiring pattern 144 and the dielectric layer 150. The third seed/barrier layer 146 may conformally cover lateral and top surfaces of the third wiring pattern 144. The third seed/barrier layer 146 may include a metal, e.g., gold (Au), titanium (Ti), and/or tantalum (Ta), or a metal nitride, e.g., titanium nitride (TiN) and/or tantalum nitride (TaN).

The wiring substrate 100 may be provided with lower substrate pads 162 on a downside thereof. For example, the lower substrate pads 162 may be disposed on a bottom surface of the first dielectric pattern 122 of the first substrate wiring layer 120 exposed by the protection layer 110, e.g., the first substrate wiring layer 120 may be between the second substrate wiring layer 130 and the lower substrate pads 162. The lower substrate pads 162 may be pads on which are disposed external coupling terminals, e.g., solder balls. The lower substrate pads 162 may be electrically connected to the first through third substrate wiring layers 120, 130, and 140. For example, the lower substrate pads 162 may penetrate the first dielectric pattern 122 of the first substrate wiring layer 120 to come into connection with the first wiring patterns 124. The lower substrate pads 162 may have a thickness ranging from about 5 μm to about 20 The lower substrate pads 162 may include a conductive material, e.g., copper (Cu).

A pad seed/barrier layer 163 may be interposed between the lower substrate pads 162 and the first dielectric pattern

122. The pad seed/barrier layer 163 may conformally cover lateral and top surfaces of the lower substrate pads 162. The pad seed/barrier layer 163 may include a metal, e.g., gold (Au), titanium (Ti), and/or tantalum (Ta), or a metal nitride, e.g., titanium nitride (TiN) and/or tantalum nitride (TaN).

The protection layer 110 may be disposed on a bottom surface of the first substrate wiring layer 120. The protection layer 110 may cover the first dielectric pattern 122 and the lower substrate pads 162. The protection layer 110 may cover the lower substrate pads 162 on the bottom surface of the first dielectric pattern 122. The protection layer 110 may have openings OP that expose the lower substrate pads 162, e.g., the protection layer 110 may cover a first portion of the lower substrate pads 162 (e.g., edges) while exposing a second portion of the lower substrate pads 162 through the openings OP (e.g., centers). For example, the lower substrate pads 162 may be buried in the protection layer 110, and only bottom surfaces of the lower substrate pads 162 may be exposed by recesses formed on the protection layer 110. The protection layer 110 may serve to protect a bottom surface of the wiring substrate 100. For example, the protection layer 110 may protect the lower substrate pads 162 of the wiring substrate 100 and wiring lines provided on the bottom surface of the first dielectric pattern 122. The protection layer 110 may have a thickness t6 ranging from about 10 μm to about 40 μm. The protection layer 110 may include a photo-imageable dielectric, a dielectric polymer, e.g., an epoxy-based polymer, an Ajinomoto build-up film (ABF), an organic material, or an inorganic material. Alternatively, the protection layer 110 may include a photoresist material.

The dielectric layer 150 may be provided on the third substrate wiring layer 140. The dielectric layer 150 may cover the top surface of the third dielectric pattern 142 included in the third substrate wiring layer 140. The dielectric layer 150 may have a thickness t4 less than the thickness t2 of each of the first through third dielectric patterns 122, 132, and 142 of the substrate wiring layers 120, 130, and 140, and less than the thickness t6 of the protection layer 110. For example, the thickness t4 of the dielectric layer 150 may range from about 1 μm to about 4 μm. The dielectric layer 150 may include a different material from those of the first through third dielectric patterns 122, 132, and 142 and the protection layer 110. For example, the dielectric layer 150 may include one or more of perylene and silicon nitride (SiN).

The wiring substrate 100 may be provided with the upper substrate pads 164 on an upside thereof. For example, the upper substrate pads 164 may be disposed on a top surface of the dielectric layer 150, e.g., the dielectric layer 150 may be between the third substrate wiring layer 140 and the upper substrate pads 164. The upper substrate pads 164 may protrude from the top surface of the dielectric layer 150. For example, as shown in FIG. 2, the upper substrate pads 164 may have a mesa shape whose width in the horizontal direction decreases with an increasing vertical distance from the dielectric layer 150. In another example, as shown in FIG. 3, the upper substrate pads 164 may have a pillar shape whose horizontal width is uniform, e.g., constant, irrespective of the vertical distance from the dielectric layer 150 (or a linear plate or bar shape depending on height of the upper substrate pads 164). The upper substrate pads 164 may be pads on which is mounted a device, e.g., a semiconductor chip and so forth. The upper substrate pads 164 may be electrically connected to the first through third substrate wiring layers 120, 130, and 140. For example, the tail portion of the third wiring pattern 144 of the third substrate wiring layer 140 may penetrate the dielectric layer 150 to come into connection with bottom surfaces of the upper substrate pads 164. A value ranging from about 30 μm to about 60 μm may be given to a width wd of the tail portion of the third wiring pattern 144, or to a width of a hole of the dielectric layer 150 for penetration of the third wiring pattern 144 through the dielectric layer 150. The upper substrate pads 164 may have a thickness t5 less than the thickness t3 of the first through third wiring patterns 124, 134, and 144 of the substrate wiring layers 120, 130, and 140. For example, the thickness t5 of the upper substrate pads 164 may range from about 1 μm to about 5 μm. The upper substrate pads 164 may include a conductive material, copper (Cu).

According to some embodiments, as the dielectric layer 150 is interposed between the upper substrate pads 164 and the head portions of the third wiring patterns 144 of the third substrate wiring layer 140 that is an uppermost substrate wiring layer of the wiring substrate 100, there may be reduced parasitic capacitance between the upper substrate pads 164 and various lines of the third wiring patterns 144 of the third substrate wiring layer 140. In addition, when a semiconductor chip is mounted on the wiring substrate 100 in a semiconductor package fabrication process, it may be possible to prevent solder balls of the semiconductor chip from being in contact with the lines of the third wiring pattern 144 of the third substrate wiring layer 140 and to prevent electrical shorts between the upper substrate pads 164 and the lines of the third wiring patterns 144. Accordingly, there may be provided the wiring substrate 100 with improved electrical properties and the semiconductor package including the wiring substrate 100.

Moreover, the thickness t4 of the dielectric layer 150 that corresponds to an upper protection layer of the wiring substrate 100 may be less than the thickness t2 of dielectric patterns of the first through third substrate wiring layers 120, 130, and 140, and the thickness t5 of the upper substrate pads 164 may be less than the thickness t3 of the first through third wiring patterns 124, 134, and 144 of the substrate wiring layers 120, 130, and 140. Therefore, there may be provided the wiring substrate 100 having a reduced overall thickness, and there may also be provided the wiring substrate 100 having a compact size and the semiconductor package including the wiring substrate 100.

Figure 4:
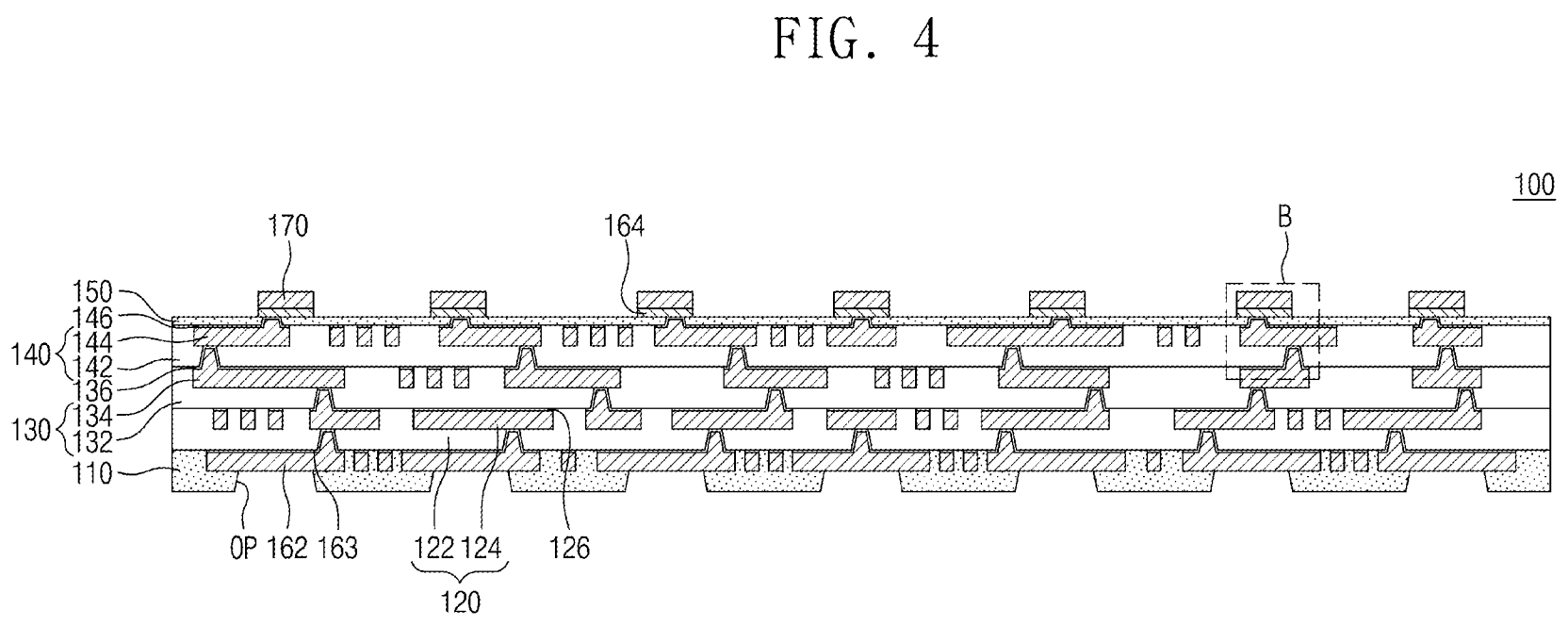
Figure 5:
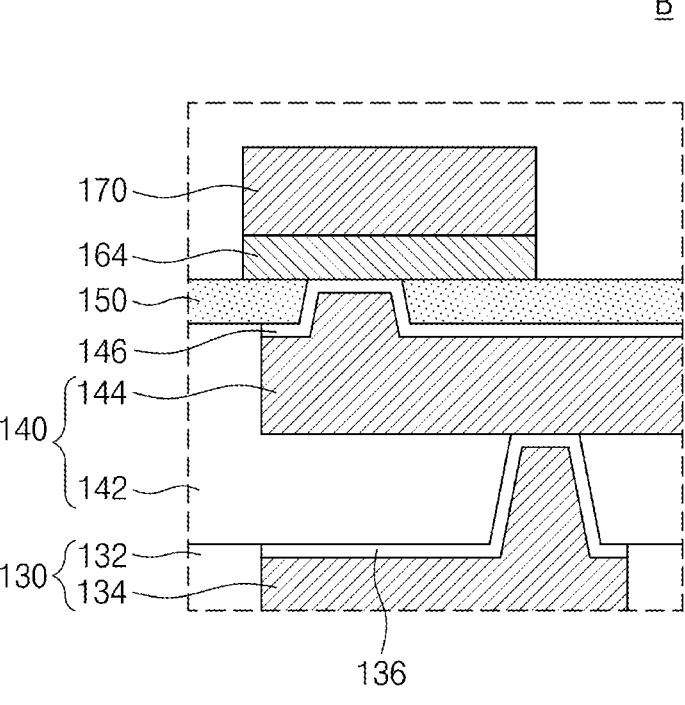
FIG. 5 illustrates an enlarged view showing section B of FIG. 4.

FIG. 4 illustrates a cross-sectional view showing a wiring structure according to some embodiments. FIG. 5 illustrates an enlarged view showing section B of FIG. 4. In the embodiments that follow, same components as those discussed with reference to FIGS. 1 to 3 are allocated the same reference numerals, and a repetitive explanation thereof will be omitted or abridged for convenience of description. The following description will focus on differences between the embodiments of FIGS. 1 to 3 and other embodiments described below.

Referring to FIGS. 4 and 5, plating layers 170 may be provided on the upper substrate pads 164. Each of the plating layers 170 may be disposed on one upper substrate pad 164. For example, as shown in FIG. 5, the plating layers 170 may have a same width as that of the upper substrate pads 164. In another example, differently from that shown in FIG. 5, the plating layers 170 may have a width less than that of the upper substrate pads 164. In yet another example, the plating layers 170 may have a width greater than that of the upper substrate pads 164. The plating layers 170 may be in contact with top surfaces of the upper substrate pads 164. For example, no intermediate layers such seed layers or barrier layers may be provided between the plating layers 170 and the upper substrate pads 164. The plating layers 170 may be provided to increase heights of the upper substrate pads 164. The plating layers 170 may include a metallic material. For example, the plating layers 170 may include copper (Cu).

FIGS. 4 and 5 depict that the plating layers 170 are provided on all of the upper substrate pads 164. For example, as illustrated in FIG. 4, the plating layers 170 may have a one-to-one correspondence with the upper substrate pads 164.

Figure 6:
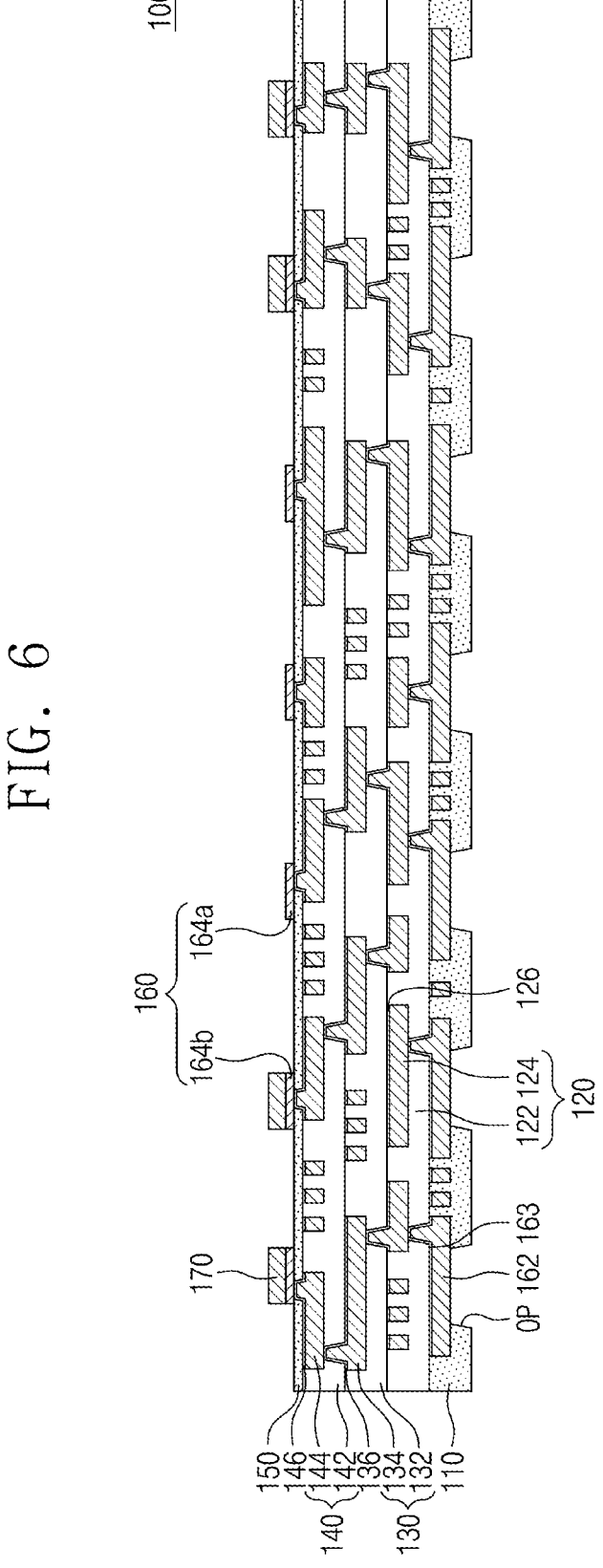
FIG. 6 illustrates a cross-sectional view showing a wiring substrate according to some embodiments.

FIG. 6 illustrates a cross-sectional view showing a wiring substrate according to some embodiments.

Referring to FIG. 6, the upper substrate pads 164 may include first upper substrate pads 164a on a central portion of the wiring substrate 100 and second upper substrate pads 164b on an outer portion of the wiring substrate 100. For example, the first upper substrate pads 164a may be pads for mounting a device, e.g., a semiconductor chip, on the wiring substrate 100, and the second upper substrate pads 164b may be pads to which are connected vertical connection terminals for connecting other package or so forth onto the wiring substrate 100.

The plating layers 170 may be provided only on the first upper substrate pads 164a or the second upper substrate pads 164b. For example, as shown in FIG. 6, the plating layers 170 may be provided only on the second upper substrate pads 164b. I another example, the plating layers 170 may be provided only on the first upper substrate pads 164a.

FIG. 6 depicts that the first upper substrate pads 164a are provided on the central portion of the wiring substrate 100, and that the second upper substrate pads 164b are provided on the wiring substrate 100. According to some embodiments, the first upper substrate pads 164a or the second upper substrate pads 164b may be pads for mounting a device, e.g., semiconductor chips, on the wiring substrate 100, and the first upper substrate pads 164a may be disposed on regions of the wiring substrate 100 that are spaced apart from regions on which the second upper substrate pads 164b are disposed on the wiring substrate 100.

Figure 7:
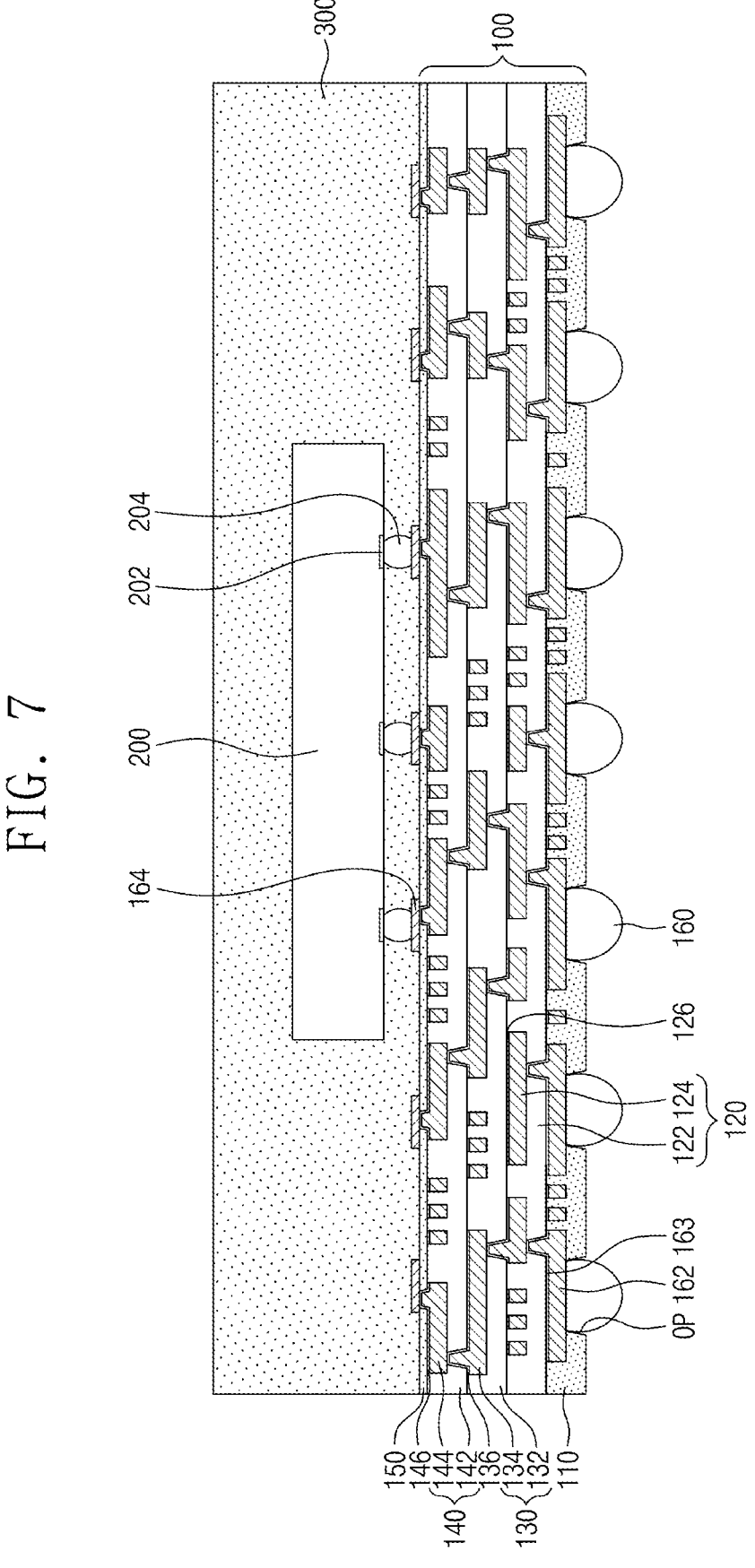

FIG. 7 illustrates a cross-sectional view showing a semiconductor package according to some embodiments.

Referring to FIG. 7, the wiring substrate 100 may be provided. The wiring substrate 100 may be substantially the same as or similar to the wiring substrate 100 discussed with reference to FIGS. 1 and 5.

External coupling terminals 160 may be disposed below the wiring substrate 100. For example, the external coupling terminals 160 may be disposed on the lower substrate pads 162 disposed on the bottom surface of the wiring substrate 100. For example, the external coupling terminals 160 may be coupled to the bottom surfaces of the lower substrate pads 162 exposed by the protection layer 110. The external coupling terminals 160 may include solder balls or solder bumps, and based on type of the external coupling terminals 160, a semiconductor package may be provided in the form of one of a ball grid array (BGA) type, a fine ball grid array (FBGA) type, and a land grid array (LGA) type.

A semiconductor chip 200 may be disposed on the wiring substrate 100. The semiconductor chip 200 may be placed on a top surface of the wiring substrate 100. The semiconductor chip 200 may be, e.g., a memory chip or a logic chip. The semiconductor chip 200 may be disposed in a face-down state on the wiring substrate 100. For example, the semiconductor chip 200 may have a front surface directed toward the wiring substrate 100 and a rear surface opposite the front surface. In this description, the language "front surface" indicates an active surface of an integrated device in a semiconductor chip or a surface on which are formed a plurality of pads of a semiconductor chip, and the language "rear surface" indicates an opposite surface that faces the front surface. The semiconductor chip 200 may include chip pads 202 on a bottom surface thereof. The chip pads 202 may be electrically connected to an integrated circuit of the semiconductor chip 200.

The semiconductor chip 200 may be mounted on the wiring substrate 100. For example, the semiconductor chip 200 may be flip-chip mounted on the wiring substrate 100. For more detail, the front surface of the semiconductor chip 200 may face the wiring substrate 100. Chip connection terminals 204 may be provided between the chip pads 202 of the semiconductor chip 200 and the upper substrate pads 164 of the wiring substrate 100. The chip connection terminals 204 may connect the chip pads 202 to the upper substrate pads 164.

A molding layer 300 may be provided on the wiring substrate 100. The molding layer 300 may cover the top surface of the wiring substrate 100. When viewed in a plan view, the molding layer 300 may encapsulate the semiconductor chip 200. The molding layer 300 may cover lateral surfaces of the semiconductor chip 200 and the rear surface of the semiconductor chip 200. Alternatively, the molding layer 300 may cover the lateral surfaces of the semiconductor chip 200, but may expose the rear surface of the semiconductor chip 200. The molding layer 300 may include a dielectric material, e.g., an epoxy molding compound (EMC).

Figure 8:
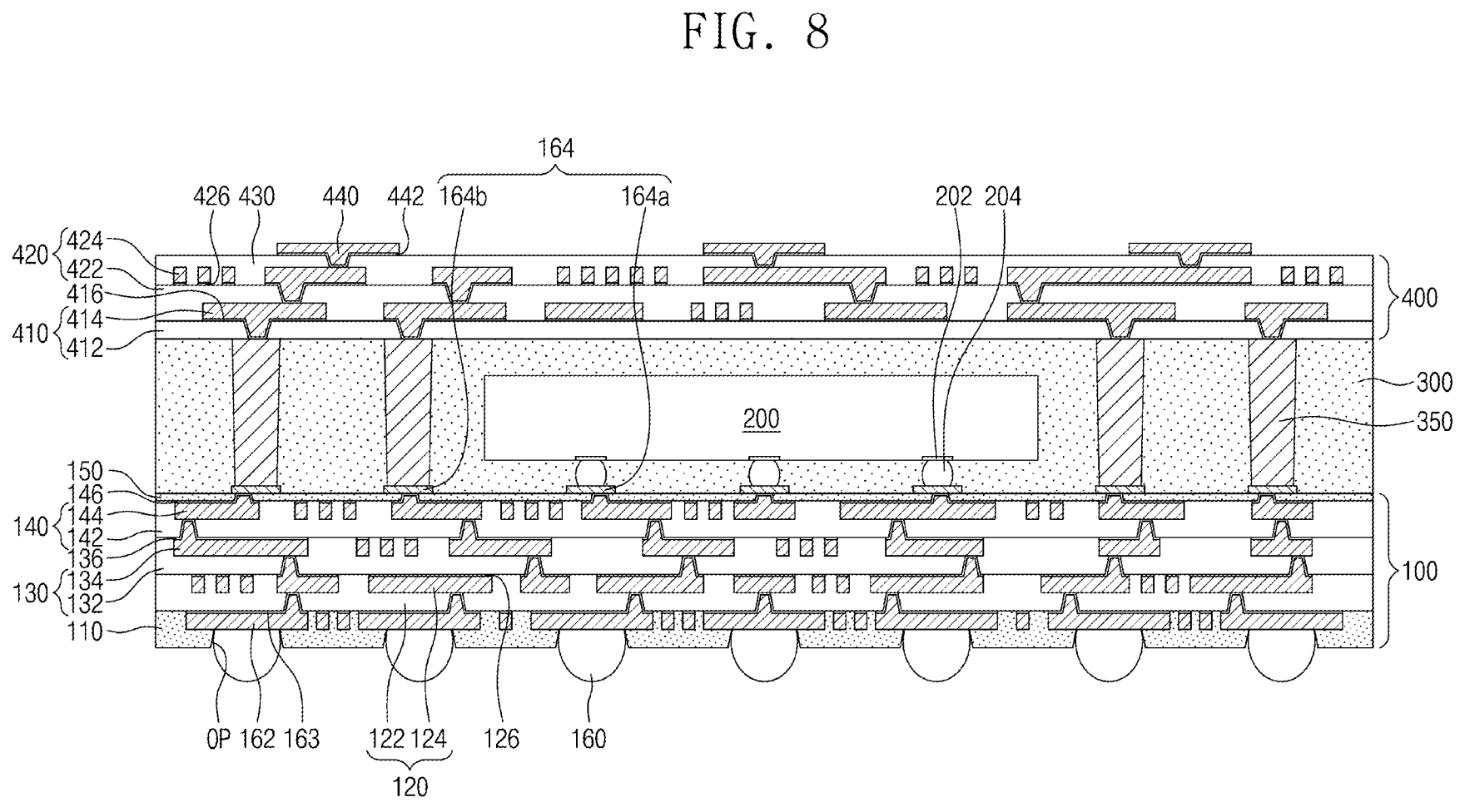

FIG. 8 illustrates a cross-sectional view showing a semiconductor package according to some embodiments.

Referring to FIG. 8, a semiconductor package may include the wiring substrate 100, the semiconductor chip 200 mounted on the wiring substrate 100, and the molding layer 300 that covers the semiconductor chip 200 on the wiring substrate 100. The wiring substrate 100 may be substantially the same as or similar to the wiring substrate 100 discussed with reference to FIGS. 1 to 6, with the exception of including a redistribution layer 400.

The upper substrate pads 164 may include the first upper substrate pads 164a on the central portion of the wiring substrate 100 and the second upper substrate pads 164b on the outer portion of the wiring substrate 100. The semiconductor chip 200 may be mounted on the first upper substrate pads 164a of the wiring substrate 100. The second upper substrate pads 164b may be positioned at a side, e.g., at a periphery, of the semiconductor chip 200.

The redistribution layer 400 may be disposed on the molding layer 300. The redistribution layer 400 may cover the semiconductor chip 200 and the molding layer 300. The redistribution layer 400 may be in direct contact with a top surface of the molding layer 300.

The redistribution layer 400 may be a redistribution substrate. For example, the redistribution layer 400 may include one or more substrate wiring layers 410 and 420. The substrate wiring layers 410 and 420 may have a fourth substrate wiring layer 410 and a fifth substrate wiring layer 420 that are sequentially stacked. The substrate wiring layers 410 and 420 may correspondingly include dielectric patterns 412 and 422, and may also correspondingly include wiring patterns 414 and 424 in the dielectric patterns 412 and 422. One of the wiring patterns 414 and 424 of the substrate wiring layers 410 and 420 may be electrically connected to a different one of the wiring patterns 414 and 424 in adjacent other substrate wiring layers 410 and 420.

The fourth substrate wiring layer 410 may be disposed on the molding layer 300. The fourth substrate wiring layer 410 may include a fourth dielectric pattern 412 and a fourth wiring pattern 414.

The fourth dielectric pattern 412 may cover the molding layer 300. For example, the fourth dielectric pattern 412 may include an inorganic dielectric layer, e.g., a silicon oxide (SiO) layer and/or a silicon nitride (SiN) layer. In another example, the fourth dielectric pattern 412 may include a polymeric material, e.g., a dielectric polymer and/or a photo-imageable dielectric (PID). For example, the photo-imageable dielectric may include at least one selected from photosensitive polyimide, polybenzoxazole (PBO), phenolic polymers, and benzocyclobutene polymers.

The fourth wiring pattern 414 may be provided in the fourth dielectric pattern 412. The fourth wiring pattern 414 may have a damascene structure. For example, the fourth wiring pattern 414 may have a head portion and a tail portion that are connected into a single unitary body. The fourth wiring pattern 414 may have a cross section shaped like an inverse T. The head portion of the fourth wiring pattern 414 may horizontally extend on and protrude onto a top surface of the fourth dielectric pattern 412. The tail portion of the fourth wiring pattern 414 may extend into the fourth dielectric pattern 412, and may be exposed on a bottom surface of the fourth dielectric pattern 412. The fourth wiring pattern 414 may include a conductive material, e.g., copper (Cu).

A fourth seed/barrier layer 416 may be interposed between the fourth wiring pattern 414 and the fourth dielectric pattern 412. The fourth seed/barrier layer 416 may conformally cover lateral and bottom surfaces of the fourth wiring pattern 414. The fourth seed/barrier layer 416 may include a metal, e.g., gold (Au), titanium (Ti), and/or tantalum (Ta), or a metal nitride, e.g., titanium nitride (TiN) and/or tantalum nitride (TaN).

The fifth substrate wiring layer 420 may be disposed on the fourth substrate wiring layer 410. The fifth substrate wiring layer 420 may include a fifth dielectric pattern 422 and a fifth wiring pattern 424.

The fifth dielectric pattern 422 may cover the fourth wiring pattern 414 on the fourth dielectric pattern 412. For example, the fifth dielectric pattern 422 may include an inorganic dielectric layer, e.g., a silicon oxide (SiO) layer and/or a silicon nitride (SiN) layer. In another example, the fifth dielectric pattern 422 may include a polymeric material, e.g., a dielectric polymer and/or a photo-imageable dielectric (PID). For example, the photo-imageable dielectric may include at least one selected from photosensitive polyimide, polybenzoxazole (PBO), phenolic polymers, and benzocyclobutene polymers.

The fifth wiring pattern 424 may be provided in the fifth dielectric pattern 422. The fifth wiring pattern 424 may have a damascene structure. For example, the fifth wiring pattern 424 may have a head portion and a tail portion that are connected into a single unitary body. The fifth wiring pattern 424 may have a cross section shaped like an inverse T. The head portion of the fifth wiring pattern 424 may horizontally extend on and protrude onto a top surface of the fifth dielectric pattern 422. The tail portion the fifth wiring pattern 424 may extend into the fifth dielectric pattern 422, and may be exposed on a bottom surface of the fifth dielectric pattern 422. The tail portion of the fifth wiring pattern 424 may be coupled to the fourth wiring pattern 414 on the bottom surface of the fifth dielectric pattern 422. The fifth wiring pattern 424 may include a conductive material, e.g., copper (Cu).

A fifth seed/barrier layer 426 may be interposed between the fifth wiring pattern 424 and the fifth dielectric pattern 422. The fifth seed/barrier layer 426 may conformally cover lateral and bottom surfaces of the fifth wiring pattern 424. The fifth seed/barrier layer 426 may include a metal, e.g., gold (Au), titanium (Ti), and/or tantalum (Ta), or a metal nitride, e.g., titanium nitride (TiN) and/or tantalum nitride (TaN).

A redistribution protection layer 430 may be provided on the fifth substrate wiring layer 420. The redistribution protection layer 430 may cover the fifth wiring pattern 424 on the fifth dielectric pattern 422. The redistribution protection layer 430 may serve to protect a top surface of the redistribution layer 400. For example, the redistribution protection layer 430 may protect the fifth wiring pattern 424 of the redistribution layer 400. For example, the redistribution protection layer 430 may include a photo-imageable dielectric, a dielectric polymer, e.g., an epoxy-based polymer, an Ajinomoto build-up film (ABF), an organic material, or an inorganic material. Alternatively, the redistribution protection layer 430 may include a photoresist material.

A conductive pattern 440 may be provided on the redistribution protection layer 430. The conductive pattern 440 may have a damascene structure. For example, the conductive pattern 440 may have a head portion and a tail portion that are connected into a single unitary body. The conductive pattern 440 may have a T-shaped cross section. The head portion of the conductive pattern 440 may horizontally extend on a top surface of the redistribution protection layer 430. The tail portion of the conductive pattern 440 may extend into the redistribution protection layer 430, and may be coupled to the fifth wiring pattern 424. The conductive pattern 440 may include a conductive material, e.g., copper (Cu).

The conductive pattern 440 may be either a pad to which an external package or an electronic apparatus is connected, or an antenna pattern for transceiving an external wireless signal. Alternatively, the conductive pattern 440 may include various conductive patterns required for operation of the semiconductor package.

A sixth seed/barrier layer 442 may be interposed between the redistribution protection layer 430 and the conductive pattern 440. The sixth seed/barrier layer 442 may conformally cover lateral and bottom surfaces of the conductive pattern 440. The sixth seed/barrier layer 442 may include a metal, e.g., gold (Au), titanium (Ti), and/or tantalum (Ta), or a metal nitride, e.g., titanium nitride (TiN) and/or tantalum nitride (TaN).

The redistribution layer 400 may be electrically connected to the wiring substrate 100. For example, the semiconductor chip 200 may be provided on its one side with a vertical connection terminal that connects the redistribution layer 400 to the wiring substrate 100. In the embodiment of FIG. 8, the vertical connection terminal may include through electrodes 350. The through electrodes 350 may be disposed on a side, e.g., periphery, of the semiconductor chip 200. The through electrodes 350 may vertically penetrate the molding layer 300. The through electrodes 350 may have first ends that extend toward the wiring substrate 100 to come into connection with the second upper substrate pads 164b of the wiring substrate 100. The through electrodes 350 may have second ends that extend toward the top surface of the molding layer 300 to come into connection with the fourth wiring patterns 414 exposed on a bottom surface of the redistribution layer 400. The through electrodes 350 may have a circular or polygonal pillar shape that vertically penetrates the molding layer 300. In this description, the term "through electrode" indicates a via that vertically penetrates a certain component, and no limitation is imposed on a planar shape of the "through electrode." For example, the shape of the "through electrode" may include a circular pillar shape, a polygonal pillar shape, a partition shape, or a wall shape. For example, the through electrodes 350 may have a width that is constant regardless of distance from the wiring substrate 100 or may have a width that decreases with increasing distance from the wiring substrate 100. The through electrodes 350 may include metal, e.g., copper (Cu).

Figure 9:
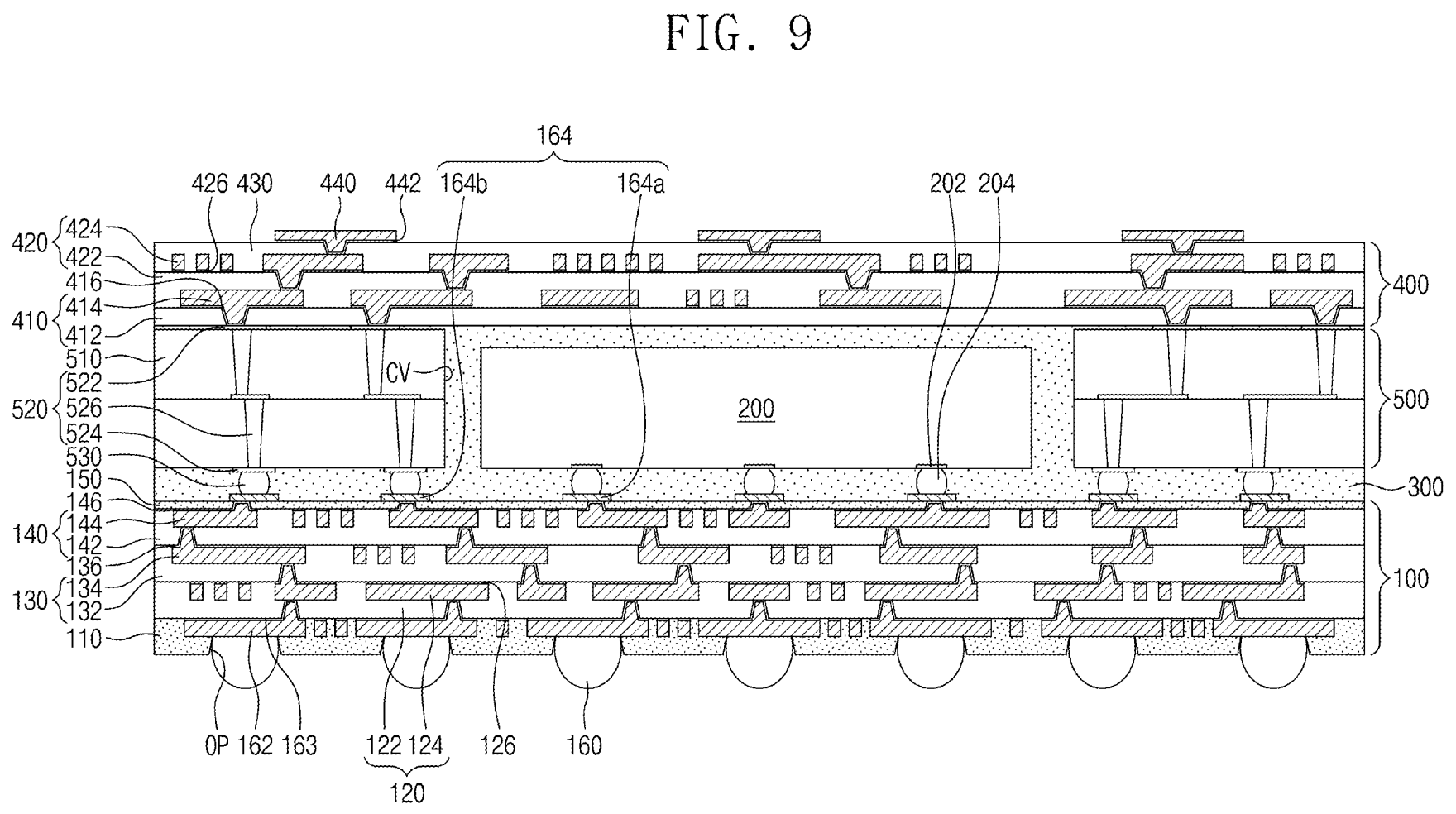

FIG. 9 illustrates a cross-sectional view showing a semiconductor package according to some embodiments.

Referring to FIG. 9, the redistribution layer 400 may be electrically connected to the wiring substrate 100. For example, the semiconductor chip 200 may be provided on its one side with a vertical connection terminal that connects the redistribution layer 400 to the wiring substrate 100. Differently from the embodiment of FIG. 8, in the embodiment of FIG. 9, the vertical connection terminal may include a connection substrate 500.

The connection substrate 500 may be disposed on the wiring substrate 100. The connection substrate 500 may have an opening CV that penetrates the connection substrate 500. For example, the opening CV may have an open hole shape that connects top and bottom surfaces of the connection substrate 500. The bottom surface of the connection substrate 500 may be spaced apart from the top surface of the wiring substrate 100. The connection substrate 500 may include a base layer 510 and a conductive member 520 that is a wiring pattern provided in the base layer 510.

The base layer 510 may include, e.g., silicon oxide. The conductive member 520 may be disposed far away from the connection substrate 500, e.g., the conductive member 520 may be disposed at a peripheral portion of the connection substrate 500 and spaced apart from the semiconductor chip 200, and the opening CV may be disposed close to the connection substrate 500, e.g., the conductive member 520 may be disposed at a central portion of the connection substrate 500 and adjacent to the semiconductor chip 200. The conductive member 520 may include upper pads 522, lower pads 524, and vias 526. The upper pads 522 may be disposed on a top surface of the base layer 510. The lower pads 524 may be disposed in a lower portion of the connection substrate 500. The vias 526 may penetrate the base layer 510 and may electrically connect the lower pads 524 to the upper pads 522.

The connection substrate 500 may be mounted on the wiring substrate 100. For example, the connection substrate 500 may be connected to the second upper substrate pad 164b of the wiring substrate 100 through connection substrate terminals 530 provided on the lower pads 524. Therefore, the connection substrate 500 may be electrically connected to the semiconductor chip 200 and the external coupling terminals 160.

The semiconductor chip 200 may be disposed on the wiring substrate 100. The semiconductor chip 200 may be disposed in the opening CV of the connection substrate 500.

The molding layer 300 may fill a space between the connection substrate 500 and the semiconductor chip 200. For example, as illustrated I FIG. 9, the molding layer 300 may encapsulate the semiconductor chip 200 in the opening CV and may cover a top surface of the semiconductor chip 200. In another example, the molding layer 300 may expose the top surface of the semiconductor chip 200. The molding layer 300 may fill a space between the redistribution layer 400 and the connection substrate 500. The fourth wiring pattern 414 exposed on the bottom surface of the redistribution layer 400 may penetrate the molding layer 300 to come into connection with the upper pads 522.

FIGS. 10 to 19 illustrate cross-sectional views showing stages in a method of fabricating a wiring substrate according to some embodiments.

Figures 10, 11:
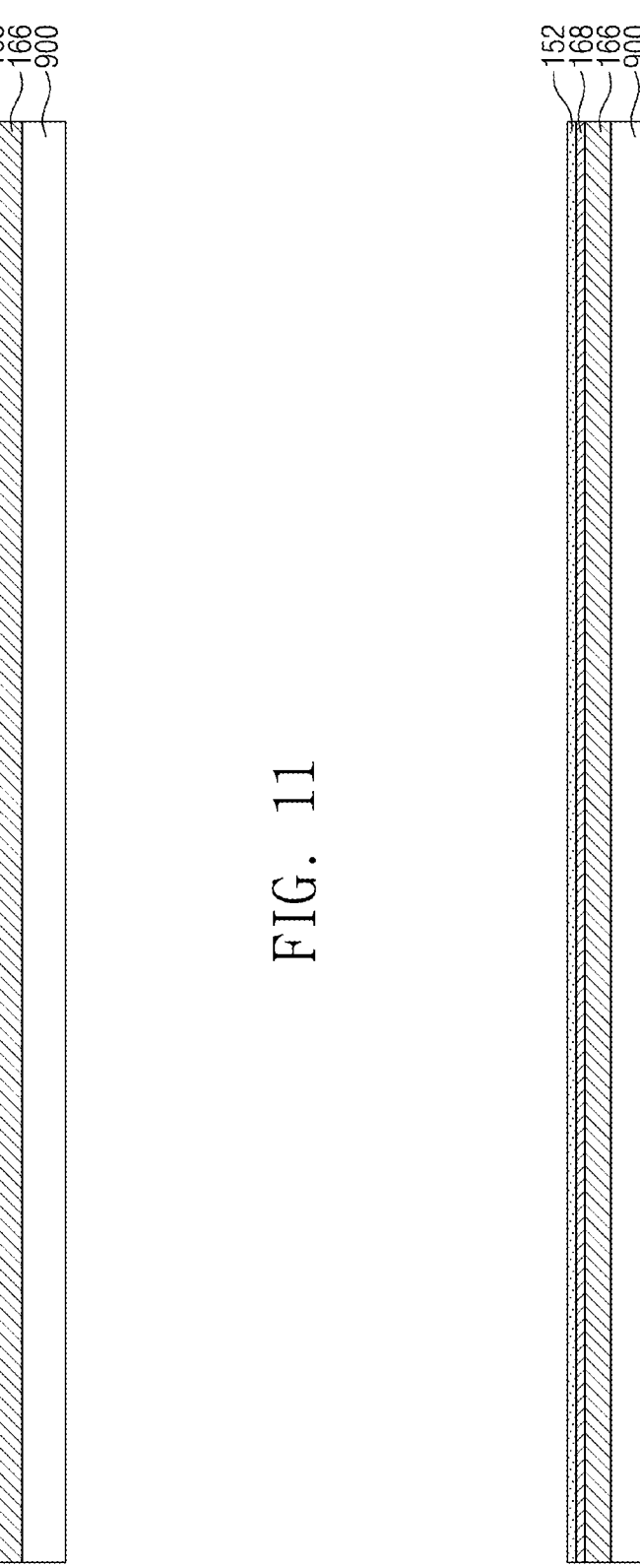

Referring to FIG. 10, a first carrier substrate 900 may be provided. The first carrier substrate 900 may be a dielectric substrate including glass or polymer, or may be a conductive substrate including metal. Although not shown, if necessary, an adhesive member may be provided on a top surface of the first carrier substrate 900. For example, the adhesive member may include a glue tape.

A first metal thin layer 166 may be formed on the first carrier substrate 900. For example, a metal foil of a first metallic material may be attached to the first carrier substrate 900, or a first metallic material may be deposited or plated on the first carrier substrate 900 to form the first metal thin layer 166. The first metal thin layer 166 may have a thickness ranging from about 15 μm to about 35 μm. The first metallic material may include metal, e.g., copper (Cu).

A second metal thin layer 168 may be formed on the first metal thin layer 166. For example, a metal foil of a second metallic material may be attached to the first metal thin layer 166, or a second metallic material may be deposited or plated on the first metal thin layer 166 to form the second metal thin layer 168. The second metal thin layer 168 may have a thickness less than that of the first metal thin layer 166. For example, the second metal thin layer 168 may have a thickness ranging from about 1 μm to about 5 μm. The second metallic material may include metal, e.g., copper (Cu).

Referring to FIG. 11, a dielectric thin layer 152 may be formed on the second metal thin layer 168. For example, a dielectric material may be deposited on the second metal thin layer 168 to form the dielectric thin layer 152. The dielectric material may include, e.g., one or more of perylene and silicon nitride (SiN). The formation of the dielectric thin layer 152 may include a low-temperature chemical vapor deposition process. For example, the dielectric thin layer 152 may be formed at a temperature equal to or less than about 150° C. The dielectric thin layer 152 may have a thickness ranging from about 1 μm to about 4 μm.

Figures 12, 13:
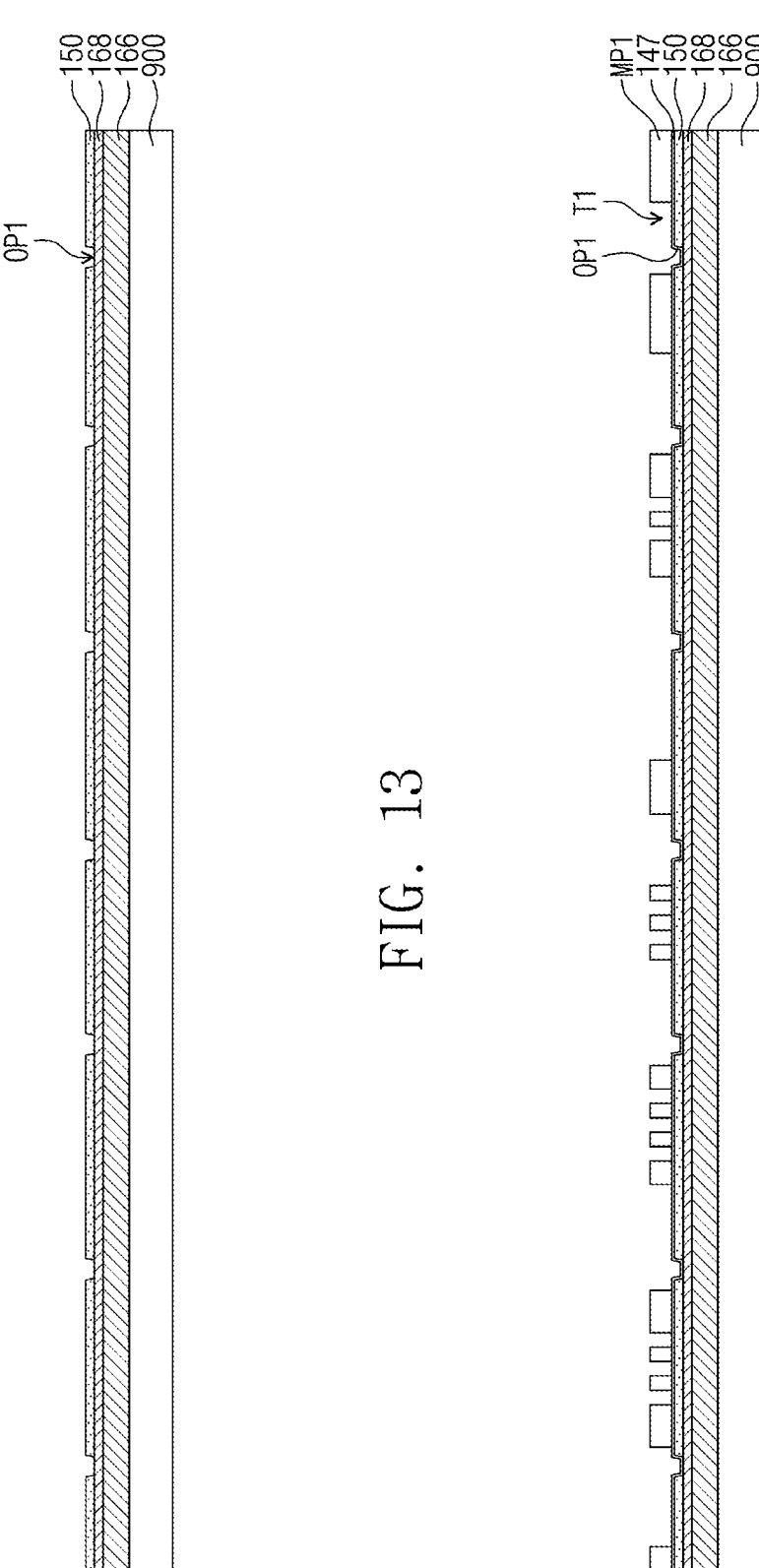

Referring to FIG. 12, the dielectric thin layer 152 may be patterned to form first openings OP1. The first openings OP1 may expose a top surface of the second metal thin layer 168. When viewed in a plan view, positions of the first openings OP1 may correspond to those where upper substrate pads 164 will be formed in a subsequent process. The first openings OP1 may have a width ranging from about 30 μm to about 60 μm, e.g., in the horizontal direction. The dielectric thin layer 152 may be patterned to form the dielectric layer 150.

Referring to FIG. 13, a preliminary seed/barrier layer 147 may be formed on the dielectric layer 150. The preliminary seed/barrier layer 147 may conformally cover the top surface of the dielectric thin layer 152 (i.e., the dielectric layer 150), and may also conformally cover bottom and inner lateral surfaces of the first openings OP1.

A first mask pattern MP1 may be formed on a top surface of the preliminary seed/barrier layer 147. For example, a photo-imageable dielectric (PID) layer may be coated on the preliminary seed/barrier layer 147, and then the photo-imageable dielectric layer may be exposed and developed to form the first mask pattern MP1. The coating process of the photo-imageable dielectric layer may include spin coating or slit coating. Afterward, the photo-imageable dielectric layer may be cured. The first mask pattern MP1 may include a photo-imageable dielectric (PID), e.g., at least one of photosensitive polyimide, polybenzoxazole (PBO), phenolic polymers, and benzocyclobutene polymers.

The development process may form first trenches T1 on the first mask pattern MP1. The first trenches T1 may expose the preliminary seed/barrier layer 147. As the first mask pattern MP1 is formed of a photo-imageable dielectric, the first trenches T1 may have a width irrespective of distance from the first carrier substrate 900, e.g., the first trenches T1 may vertically overlap the first openings OP1. The first trenches T1 may be spatially connected to, e.g., in fluid communication with, the first openings OP1. The width of the first trenches T1 may be greater than that of the first openings OP1, e.g., in the horizontal direction. The first trench T1 and its connected first opening OP1 may have a T-shaped cross section. The first trenches T1 and the first openings OP1 may provide a space where the third wiring pattern 144 will be formed in a subsequent process.

Figures 14, 15:
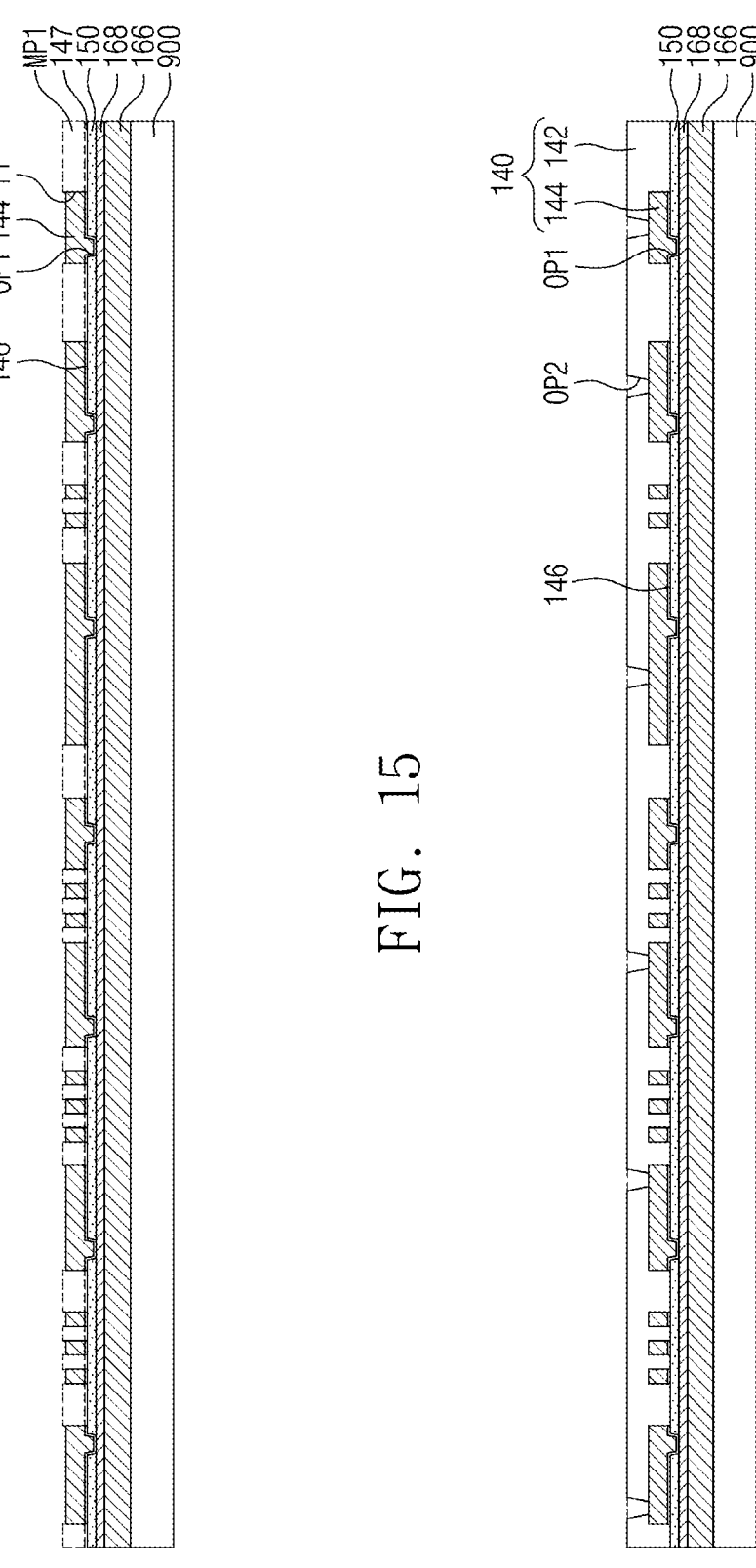

Referring to FIG. 14, the third wiring pattern 144 may be formed on the preliminary seed/barrier layer 147 exposed by the first trenches T1 and the first openings OP1. For example, a conductive layer may be formed on the preliminary seed/barrier layer 147 to fill the first trenches T1 and the first openings OP1 and to cover a top surface of the first mask pattern MP1. The conductive layer may be formed by performing an electroplating process in which the preliminary seed/barrier layer 147 is used as a seed. The conductive layer may extend onto the top surface of the first mask pattern MP1. The conductive layer may undergo a planarization process to form the third wiring pattern 144. The planarization process may be performed by, e.g., a chemical mechanical polishing (CMP) process. The planarization process may continue until the top surface of the first mask pattern MP1 is exposed. The conductive layer may include metal, e.g., copper (Cu). The conductive layer may have a thickness ranging from about 5 μm to about 20 μm on the dielectric layer 150.

After that, the first mask pattern MP1 may be removed. Therefore, a portion of the preliminary seed/barrier layer 147 may be exposed below the first mask pattern MP1. For example, the third wiring pattern 144 may be used as a mask to perform an etching process on the portion of the preliminary seed/barrier layer 147. The preliminary seed/barrier layer 147 may be etched to form the third seed/barrier layer 146 positioned below the third wiring pattern 144.

Referring to FIG. 15, the third dielectric pattern 142 may be formed on the dielectric layer 150. For example, a dielectric film may be formed by depositing a dielectric material on the dielectric layer 150 so as to cover the third wiring pattern 144. Afterward, the dielectric film may undergo a patterning process to form the third dielectric pattern 142 having second openings OP2. The second openings OP2 may expose a top surface of the third wiring pattern 144. The second openings OP2 may have a width that increases with increasing distance from the third wiring pattern 144. The dielectric film may have a thickness ranging from about 10 μm to about 40 μm. Therefore, the third substrate wiring layer 140 may be formed to have the third wiring pattern 144 and the third dielectric pattern 142.

Figures 16, 17:
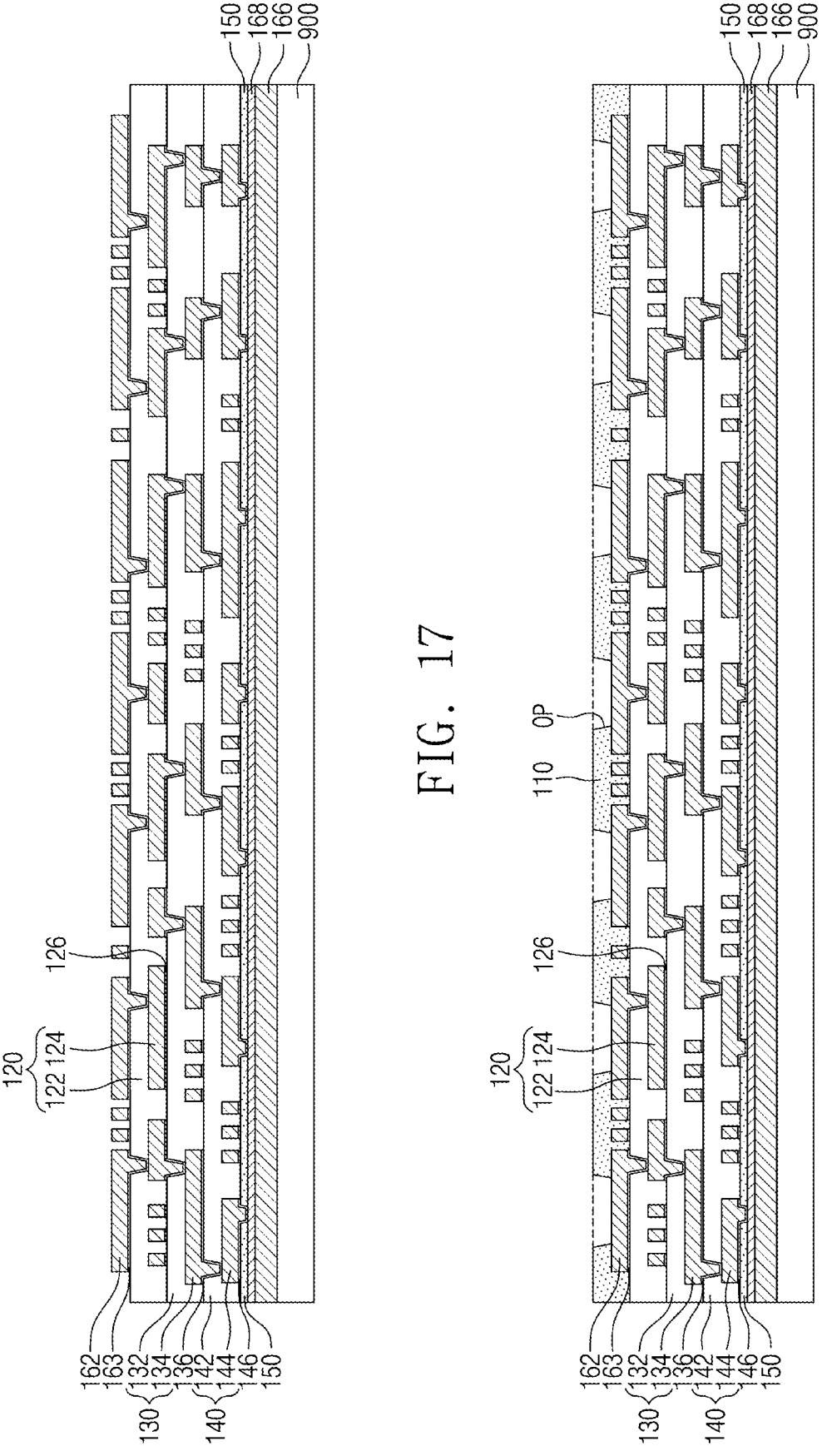

Referring to FIG. 16, the second substrate wiring layer 130 and the first substrate wiring layer 120 may be sequentially formed on the third substrate wiring layer 140. The formation of the second substrate wiring layer 130 and the formation of the first substrate wiring layer 120 may be substantially the same as or similar to the formation of the first substrate wiring layer 120 discussed with reference to FIGS. 13 to 15. For example, a preliminary seed/barrier layer may be formed on the third substrate wiring layer 140 to conformally cover a top surface of the third dielectric pattern 142 and bottom and inner lateral surfaces of the second openings OP2, forming on the preliminary seed/barrier layer a mask pattern having a trench, forming the second wiring pattern 134 to fill the second openings OP2 and the trench of the mask pattern, removing the mask pattern, patterning the preliminary seed/barrier layer to form the second seed/barrier layer 136, depositing a dielectric layer on the third dielectric pattern 142, and then forming the second dielectric pattern 132 by forming openings to expose the second wiring pattern 134. For example, a preliminary seed/barrier layer may be formed on the second substrate wiring layer 130 to conformally cover a top surface of the second dielectric pattern 132 and bottom and inner lateral surfaces of the openings, forming on the preliminary seed/barrier layer a mask pattern having a trench, forming the first wiring pattern 124 to fill the openings and the trench of the mask pattern, removing the mask pattern, patterning the preliminary seed/barrier layer to form the first seed/barrier layer 126, depositing a dielectric layer on the second dielectric pattern 132, and then forming the first dielectric pattern 122 by forming openings to expose the first wiring pattern 124.

After the formation of the second substrate wiring layer 130 and the first substrate wiring layer 120, openings exposing the first wiring pattern 124 may be formed on the first dielectric pattern 122 of the first substrate wiring layer 120. A preliminary seed/barrier layer may be formed on the first substrate wiring layer 120 to conformally cover a top surface of the first dielectric pattern 122 and bottom and inner lateral surfaces of the openings, forming on the preliminary seed/barrier layer a mask pattern having a trench, forming the lower substrate pads 162 to fill the openings and the trench of the mask pattern, removing the mask pattern, and patterning the preliminary seed/barrier layer to form the pad seed/barrier layer 163.

Referring to FIG. 17, the protection layer 110 may be formed on the first substrate wiring layer 120. For example, a dielectric material may be deposited on the first dielectric pattern 122, and then the dielectric material may be patterned to form openings OP that expose the lower substrate pads 162. The protection layer 110 may include a photo-imageable dielectric, a dielectric polymer, e.g., an epoxy-based polymer, an Ajinomoto build-up film (ABF), an organic material, or an inorganic material. Alternatively, the protection layer 110 may include a photoresist material.

Figures 18, 19:
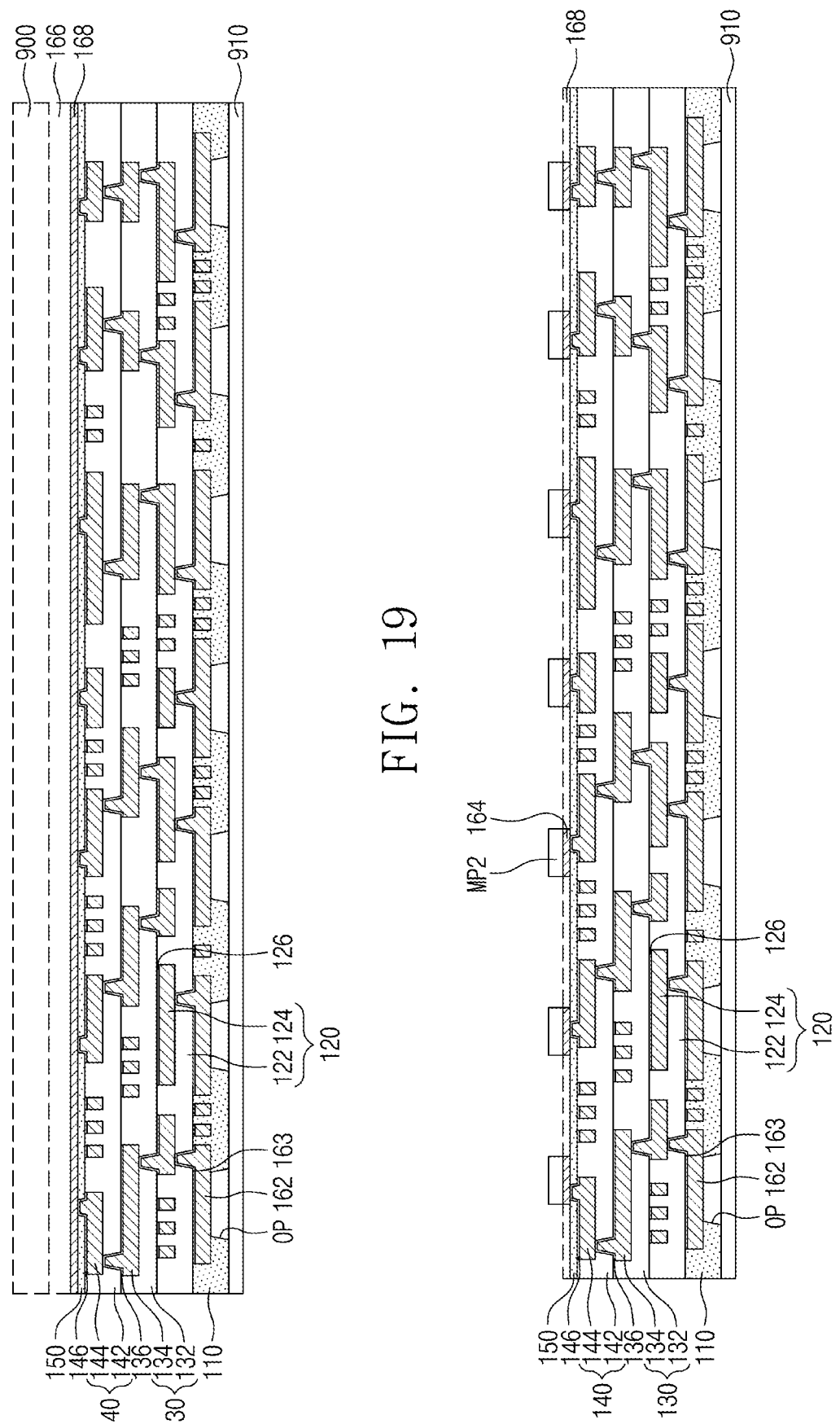

Referring to FIG. 18, a second carrier substrate 910 may be provided on the protection layer 110. The second carrier substrate 910 may be attached to the protection layer 110. The second carrier substrate 910 may be a dielectric substrate including glass or polymer, or may be a conductive substrate including metal. Although not shown, if necessary, an adhesive member may be provided on a top surface of the second carrier substrate 910. For example, the adhesive member may include a glue tape.

After that, the first carrier substrate 900 may be removed. In this step, the first metal thin layer 166 may also be removed. Therefore, the second metal thin layer 168 may be exposed.

Referring to FIG. 19, a second mask pattern MP2 may be formed on the second metal thin layer 168. For example, a photo-imageable dielectric (PID) layer may be coated on the second metal thin layer 168, and then the photo-imageable dielectric layer may be exposed and developed to form the second mask pattern MP2. The coating process of the photo-imageable dielectric layer may include spin coating or slit coating. Afterward, the photo-imageable dielectric layer may be cured. The second mask pattern MP2 may include a photo-imageable dielectric (PID), e.g., at least one of photosensitive polyimide, polybenzoxazole (PBO), phenolic polymers, and benzocyclobutene polymers. The second mask pattern MP2 may overlap a region where upper substrate pads 164 will be formed in a subsequent process.

Thereafter, the second mask pattern MP2 may be used as an etch mask to etch the second metal thin layer 168. The second metal thin layer 168 may be patterned to form the upper substrate pads 164.

Referring back to FIG. 1, the second mask pattern MP2 may be removed. After that, the second carrier substrate 910 may be removed. The processes mentioned above may fabricate the wiring substrate 100 discussed with reference to FIGS. 1 to 3.

Figures 20, 21:
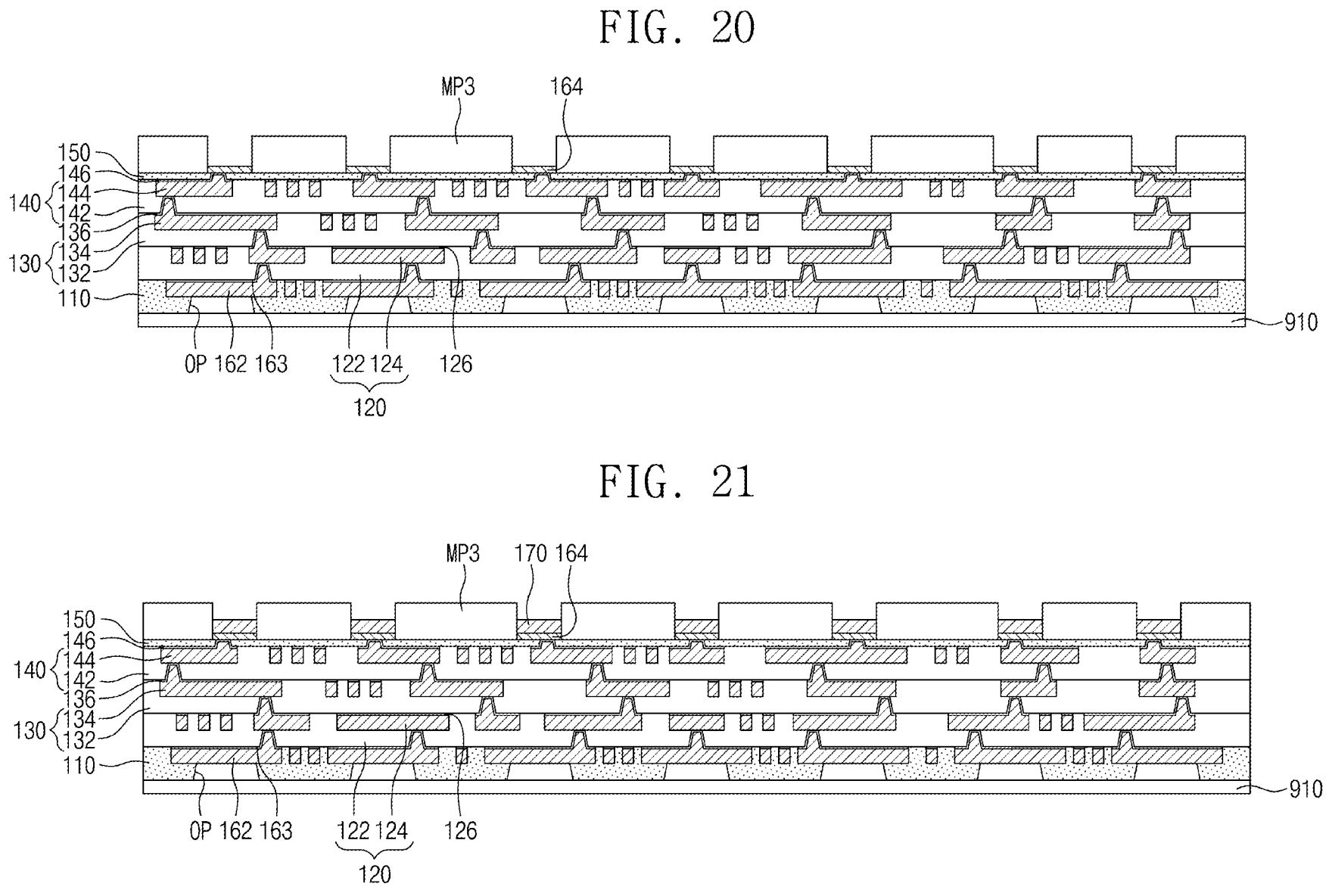

FIGS. 20 and 21 illustrate cross-sectional views showing stages in a method of fabricating a wiring substrate according to some embodiments.

Referring to FIG. 20, the second mask pattern MP2 may be removed from the resultant structure of FIG. 19. A third mask pattern MP3 may be formed.

For example, a photo-imageable dielectric (PID) layer may be coated on the dielectric layer 150, and then the photo-imageable dielectric layer may be exposed and developed to form the third mask pattern MP3. The coating process of the photo-imageable dielectric layer may include spin coating or slit coating. Afterward, the photo-imageable dielectric layer may be cured. The third mask pattern MP3 may include a photo-imageable dielectric (PID), e.g., at least one of photosensitive polyimide, polybenzoxazole (PBO), phenolic polymers, and benzocyclobutene polymers. The third mask pattern MP3 may expose the upper substrate pads 164.

Referring to FIG. 21, the plating layers 170 may be formed on the upper substrate pads 164 exposed by the third mask pattern MP3. For example, a conductive layer may be formed to the upper substrate pads 164 to fill a pattern inside of the third mask pattern MP3. The conductive layer may be formed by performing an electroplating process in which the upper substrate pads 164 are used as a seed. Therefore, no intermediate layers, e.g., seed layers or barrier layers may be formed between the upper substrate pads 164 and the plating layers 170. The conductive layer may include metal, e.g., copper (Cu).

Referring to FIGS. 4 and 5, the third mask pattern MP3 may be removed. After that, the second carrier substrate 910 may be removed. The processes mentioned above may fabricate the wiring substrate 100 discussed with reference to FIGS. 4 and 5.

Figure 22:
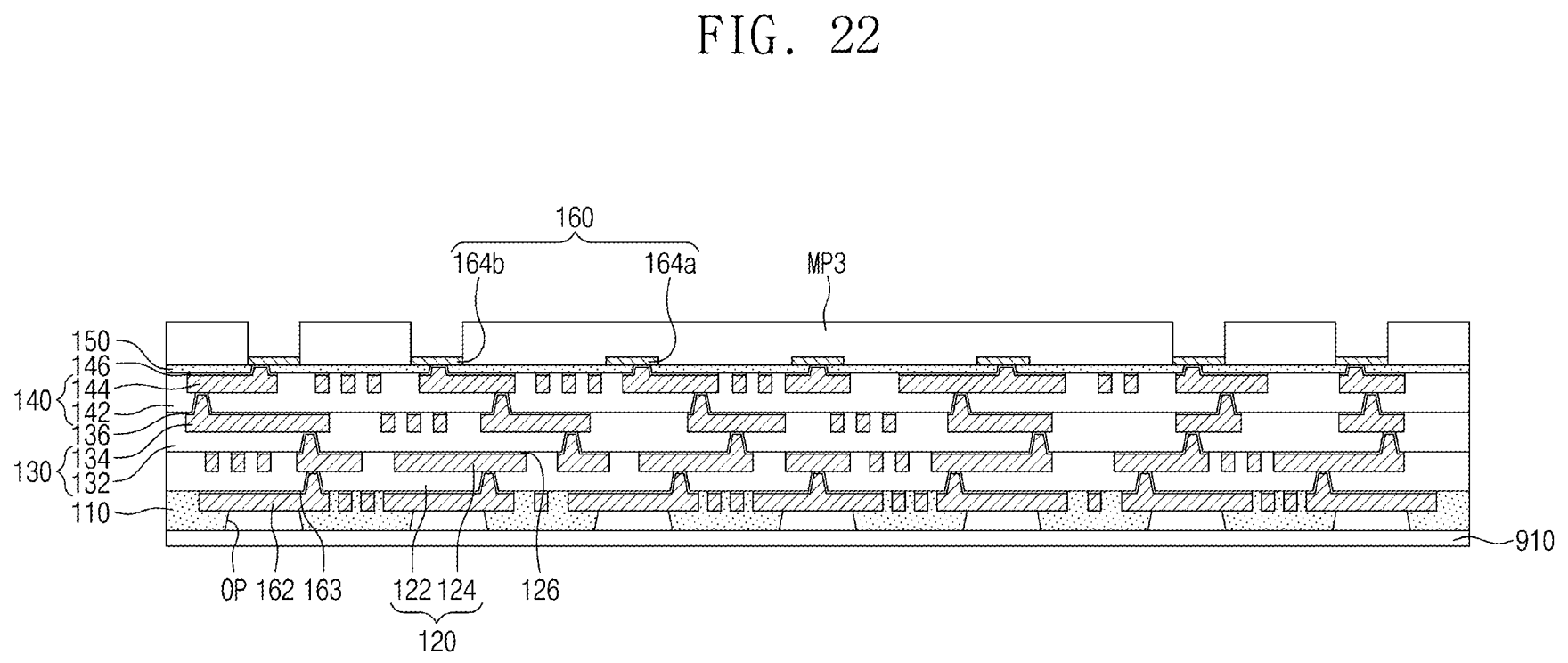
Figure 23:
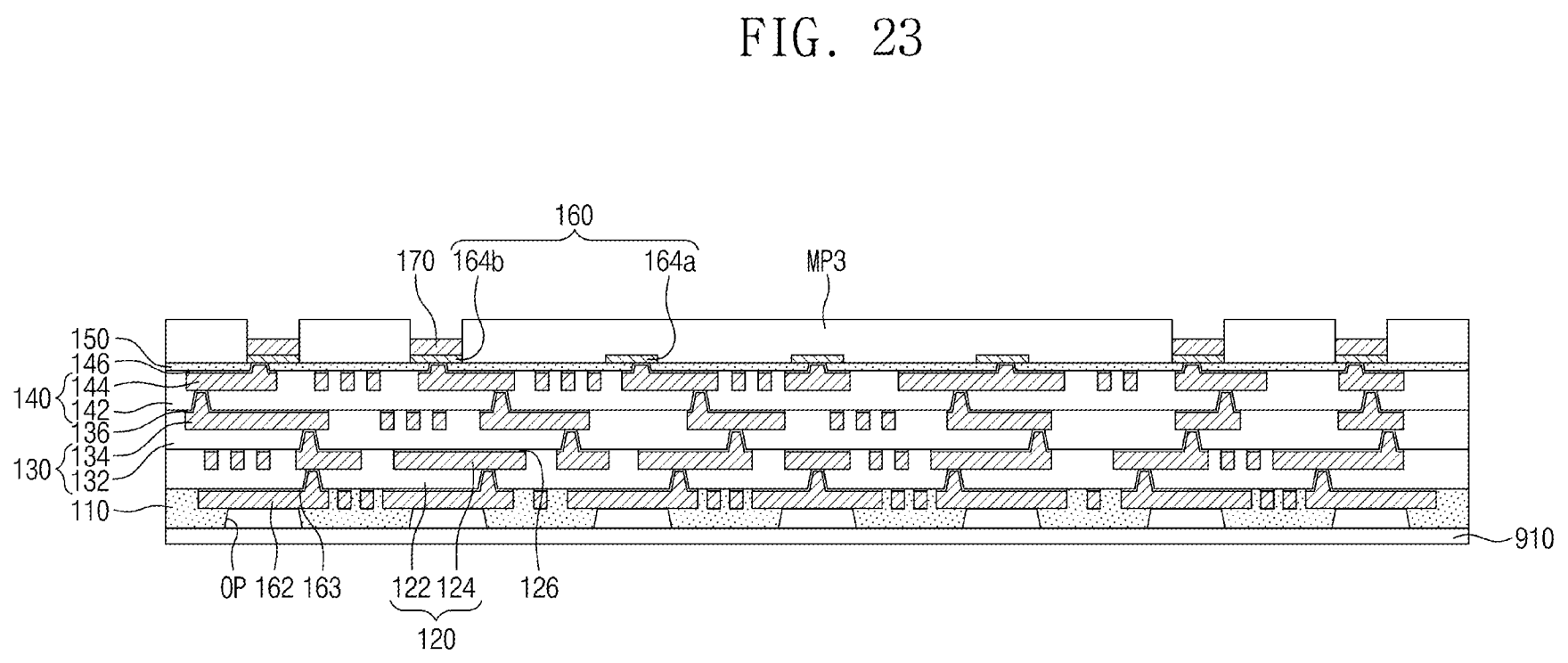

FIGS. 22 and 23 illustrate cross-sectional views showing stages in a method of fabricating a wiring substrate according to some embodiments.

Referring to FIG. 22, the second mask pattern MP2 may be removed from the resultant structure of FIG. 19. The upper substrate pads 164 may include the first upper substrate pads 164a on the central portion of the wiring substrate 100 and the second upper substrate pads 164b on the outer portion of the wiring substrate 100.

A third mask pattern MP3 may be formed. For example, a photo-imageable dielectric (PID) layer may be coated on the dielectric layer 150, and then the photo-imageable dielectric layer may be exposed and developed to form the third mask pattern MP3. The coating process of the photo-imageable dielectric layer may include spin coating or slit coating. Afterward, the photo-imageable dielectric layer may be cured. The third mask pattern MP3 may cover the first upper substrate pads 164*a* and expose the second upper substrate pads 164*b*.

Referring to FIG. 23, the plating layers 170 may be formed on the second upper substrate pads 164*b* exposed by the third mask pattern MP3. For example, a conductive layer may be formed on the second upper substrate pads 164*b* to fill a pattern inside of the third mask pattern MP3. The conductive layer may be formed by performing an electroplating process in which the upper substrate pads 164 are used as a seed. Therefore, the plating layers 170 may be formed only on ones of the upper substrate pads 164.

Referring to FIG. 6, the third mask pattern MP3 may be removed. After that, the second carrier substrate 910 may be removed. The processes mentioned above may fabricate the wiring substrate 100 discussed with reference to FIG. 6.

By way of summation and review, embodiments provide a compact-sized semiconductor package and a method of fabricating the same. Embodiments also provide a semiconductor package with improved electrical properties and a method of fabricating the same.

That is, in a semiconductor package according to some embodiments, a dielectric layer may be interposed between the upper substrate pads and the head portions of wiring patterns of an uppermost substrate wiring layer of a wiring substrate. Thus, parasitic capacitance between the upper substrate pads and various lines of the wring patterns of the uppermost substrate wiring layer may be reduced. In addition, when a semiconductor chip is mounted on the wiring substrate in a semiconductor package fabrication process, it may be possible to prevent solder balls of the semiconductor chip from being in contact with the lines of the wiring patterns of the uppermost substrate wiring layer and to prevent electrical shorts between the upper substrate pads and the lines. Accordingly, a wiring substrate with improved electrical properties and a semiconductor package including the wiring substrate may be provided.

Moreover, a thickness of the dielectric layer that corresponds to an upper protection layer of the wiring substrate may be provided to be smaller than that of dielectric patterns of the substrate wiring layers, and a thickness of the upper substrate pads may be provided to be smaller than that of the wiring patterns of the substrate wiring layers. Accordingly, a wiring substrate with improved electrical properties and a semiconductor package including the wiring substrate may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
wiring layers that are sequentially stacked;
a lower substrate pad on a bottom surface of a lowermost one of the wiring layers;
a protection layer on the bottom surface of the lowermost one of the wiring layers, the protection layer covering a first portion of the lower substrate pad, and the protection layer including an opening exposing a second portion of the lower substrate pad;
a dielectric layer on a top surface of an uppermost one of the wiring layers;
an upper substrate pad on the dielectric layer;
a semiconductor chip on the upper substrate pad; and
a molding layer on the uppermost one of the wiring layers, the molding layer covering the semiconductor chip,
wherein each of the wiring layers includes:
a dielectric pattern, a thickness of the dielectric layer being less than a thickness of the dielectric pattern; and
a wiring pattern in the dielectric pattern, a thickness of the upper substrate pad being less than a thickness of the wiring pattern,
wherein the semiconductor chip comprises a chip pad at a bottom surface of the semiconductor chip, and
wherein the chip pad is electrically connected to the upper substrate pad.

2. The semiconductor package as claimed in claim 1, wherein:
the wiring pattern of each of the wiring layers includes:
a head portion in the dielectric pattern; and
a tail portion on the head portion, the tail portion penetrating the dielectric pattern, and
the thickness of the wiring pattern in the uppermost one of the wiring layers corresponds to a thickness of the head portion in the uppermost one of the wiring layers.

3. The semiconductor package as claimed in claim 2, wherein the tail portion of the wiring pattern included in the uppermost one of the wiring layers penetrates the dielectric pattern and contacts a bottom surface of the upper substrate pad.

4. The semiconductor package as claimed in claim 2, wherein a width of the tail portion of the wiring pattern in the uppermost one of the wiring layers is in a range of about 30 μm to about 60 μm.

5. The semiconductor package as claimed in claim 1, wherein:
the upper substrate pad is on a top surface of the dielectric layer,
the lower substrate pad is buried in the protection layer, and
a bottom surface of the lower substrate pad is exposed by a recess on the protection layer.

6. The semiconductor package as claimed in claim 1, wherein:
the thickness of the dielectric layer is in a range of about 1 μm to about 4 μm, and
the thickness of the dielectric pattern in each of the wiring layers is in a range of about 10 μm to about 40 μm.

7. The semiconductor package as claimed in claim 1, wherein:
the thickness of the upper substrate pad is in a range of about 1 μm to about 5 μm, and
the thickness of the wiring pattern in the wiring layers is in a range of about 5 μm to about 20 μm.

8. The semiconductor package as claimed in claim 1, wherein the dielectric layer includes a material different from a material of the protection layer and from a material of the dielectric pattern in the wiring layers.

9. The semiconductor package as claimed in claim 8, wherein:
the dielectric layer includes one or more of perylene and silicon nitride, and the wiring layers and the protection layer include a photo-imageable dielectric or a dielectric polymer.

10. The semiconductor package as claimed in claim 1, wherein the upper substrate pad has:

a mesa shape having a width decreasing with an increasing distance from the dielectric layer; or a pillar shape with a constant width.

11. The semiconductor package as claimed in claim 1, further comprising a plating layer on the upper substrate pad.

12. The semiconductor package as claimed in claim 1, wherein the chip pad is electrically connected to the upper substrate pad by a chip connection terminal.

13. The semiconductor package as claimed in claim 12, wherein the chip connection terminal is between the chip pad and the upper substrate pad.

14. A semiconductor package, comprising:

a wiring substrate;

a semiconductor chip on the wiring substrate; and a molding layer on the wiring substrate, the molding layer covering the semiconductor chip, wherein the wiring substrate includes:

dielectric patterns that are sequentially stacked;

wiring patterns in the dielectric patterns;

a dielectric layer covering a top surface of an uppermost one of the dielectric patterns, a thickness of the dielectric layer being less than a thickness of each of the dielectric patterns, and the thickness of the dielectric layer being in a range of about 1 μm to about 4 μm;

an upper substrate pad on the dielectric layer;

lower substrate pads on a bottom surface of a lowermost one of the dielectric patterns; and a protection layer on the bottom surface of the lowermost one of the dielectric patterns, the protection layer covering first portions of the lower substrate pads, and the protection layer including openings exposing second portions of the lower substrate pads, wherein the semiconductor chip comprises a chip pad at a bottom surface of the semiconductor chip, and wherein the chip pad is electrically connected to the upper substrate pad.

15. The semiconductor package as claimed in claim 14, wherein the wiring patterns include:

a head portion in one of the dielectric patterns, the head portion constituting a horizontal wiring line; and a tail portion connected to a top surface of the head portion, the tail portion penetrating one of the dielectric patterns and contacts an adjacent one of the wiring patterns.

16. The semiconductor package as claimed in claim 15, wherein the tail portion of an uppermost one of the wiring patterns penetrates the dielectric layer and contacts the upper substrate pads.

17. The semiconductor package as claimed in claim 14, wherein:

the upper substrate pads extend onto a top surface of the dielectric layer, and the lower substrate pads are buried within the protection layer.

18. The semiconductor package as claimed in claim 14, wherein the thickness of each of the dielectric patterns is in a range of about 10 μm to about 40 μm.

19. The semiconductor package as claimed in claim 14, wherein:

a thickness of each of the upper substrate pads is less than a thickness of each of the wiring patterns, the thickness of each of the upper substrate pads is in a range of about 1 μm to about 5 μm, and the thickness of each of the wiring patterns is in a range of about 5 μm to about 20 μm.

20. The semiconductor package as claimed in claim 14, further comprising plating layers on the upper substrate pads, the plating layers being on only some of the upper substrate pads.

* * * * *